(12) United States Patent
Noh et al.

(10) Patent No.: US 11,699,728 B2
(45) Date of Patent: Jul. 11, 2023

(54) SEMICONDUCTOR DEVICE INCLUDING FIN-FET AND MISALIGNED SOURCE AND DRAIN CONTACTS

(71) Applicant: SAMSUNG ELECTRONICS CO., LTD., Suwon-si (KR)

(72) Inventors: Chang Woo Noh, Hwaseong-si (KR); Seung Min Song, Hwaseong-si (KR); Geum Jong Bae, Hwaseong-si (KR); Dong Il Bae, Hwaseong-si (KR)

(73) Assignee: SAMSUNG ELECTRONICS CO., LTD.

(*) Notice: Subject to any disclaimer, the term of this patent is extended or adjusted under 35 U.S.C. 154(b) by 45 days.

(21) Appl. No.: 17/127,230

(22) Filed: Dec. 18, 2020

(65) Prior Publication Data

US 2021/0104613 A1  Apr. 8, 2021

Related U.S. Application Data

(63) Continuation of application No. 16/205,851, filed on Nov. 30, 2018, now Pat. No. 10,903,324.

(30) Foreign Application Priority Data

Jun. 20, 2018  (KR) .................. 10-2018-0070820

(51) Int. Cl.
*H01L 29/66* (2006.01)
*H01L 29/417* (2006.01)
(Continued)

(52) U.S. Cl.
CPC .. *H01L 29/41791* (2013.01); *H01L 21/76897* (2013.01); *H01L 29/0653* (2013.01);
(Continued)

(58) Field of Classification Search
CPC .......... H01L 29/41791; H01L 29/66795; H01L 21/76897; H01L 29/0653; H01L 29/7853;
(Continued)

(56) References Cited

U.S. PATENT DOCUMENTS 9,478,622 B2   10/2016  Yu et al.
9,490,254 B2   11/2016  Hsiao et al.
(Continued)

FOREIGN PATENT DOCUMENTS

KR   20160059862 A   5/2016
KR   20160136042 A   11/2016

OTHER PUBLICATIONS

Office Action for Korean Patent Application No. 10-2018-0070820 dated Feb. 6, 2023, 5 pages, no translation.

*Primary Examiner* — Ismail A Muse
(74) *Attorney, Agent, or Firm* — Myers Bigel, P.A.

(57) ABSTRACT

A semiconductor device including a fin field effect transistor (fin-FET) includes active fins disposed on a substrate, isolation layers on both sides of the active fins, a gate structure formed to cross the active fins and the isolation layers, source/drain regions on the active fins on sidewalls of the gate structure, a first interlayer insulating layer on the isolation layers in contact with portions of the sidewalls of the gate structure and portions of surfaces of the source/drain regions, an etch stop layer configured to overlap the first interlayer insulating layer, the sidewalls of the gate structure, and the source/drain regions, and contact plugs formed to pass through the etch stop layer to contact the source/drain regions. The source/drain regions have main growth portions in contact with upper surfaces of the active fins.

20 Claims, 18 Drawing Sheets

(51) Int. Cl.
  *H01L 21/768* (2006.01)
  *H01L 29/06* (2006.01)
  *H01L 29/78* (2006.01)
(52) U.S. Cl.
  CPC .... *H01L 29/66795* (2013.01); *H01L 29/7853* (2013.01); *H01L 2029/7858* (2013.01)
(58) Field of Classification Search
  CPC ........... H01L 2029/7858; H01L 29/665; H01L 27/0886; H01L 21/823431; H01L 29/785; H01L 29/66545; H01L 21/823475
  See application file for complete search history.

(56) References Cited

U.S. PATENT DOCUMENTS

| | | |
|---|---|---|
| 9,530,871 B1 | 12/2016 | Tsai et al. |
| 9,564,369 B1 | 2/2017 | Kim et al. |
| 9,853,111 B2 | 12/2017 | Choi et al. |
| 9,853,128 B2 | 12/2017 | Zang et al. |
| 2014/0203370 A1 | 7/2014 | Maeda et al. |
| 2015/0035023 A1 | 2/2015 | Kim et al. |
| 2016/0079248 A1 | 3/2016 | Basker et al. |
| 2016/0141417 A1 | 5/2016 | Park et al. |
| 2016/0322393 A1 | 11/2016 | Basker et al. |
| 2016/0343709 A1 | 11/2016 | Kim et al. |
| 2016/0351570 A1 | 12/2016 | Park et al. |
| 2017/0148914 A1 | 5/2017 | Lee et al. |
| 2017/0256456 A1* | 9/2017 | Lee ..................... H01L 29/7848 |
| 2017/0287910 A1 | 10/2017 | Fung |
| 2017/0317213 A1 | 11/2017 | Park et al. |
| 2017/0352559 A1* | 12/2017 | Liu ..................... H01L 21/0274 |
| 2017/0373060 A1 | 12/2017 | Zeng |
| 2018/0033866 A1* | 2/2018 | Liao .................. H01L 29/42376 |
| 2019/0088542 A1 | 3/2019 | Hsieh et al. |
| 2019/0279930 A1* | 9/2019 | Hong ................ H01L 21/76895 |
| 2020/0027793 A1 | 1/2020 | Lee et al. |

* cited by examiner

SEMICONDUCTOR DEVICE INCLUDING FIN-FET AND MISALIGNED SOURCE AND DRAIN CONTACTS

CROSS-REFERENCE TO THE RELATED APPLICATIONS

This U.S. Non-provisional application is a continuation of U.S. patent application Ser. No. 16/205,851, filed Nov. 30, 2018, which itself claims priority under 35 USC § 119 to Korean Patent Application No. 10-2018-0070820, filed on Jun. 20, 2018, the disclosures of which are incorporated herein by reference in their entireties.

BACKGROUND

Devices and methods relate to a semiconductor device including a fin field effect transistor (fin-FET) and a method of manufacturing the same.

According to the demand of high integration of semiconductor devices, it is becoming more difficult to form a plurality of contact plugs in a restricted space. Contact plugs function to provide an electrical connection between lower patterns and upper lines.

When the lower patterns are excessively recessed in a process of forming contact plugs, parasitic capacitance is generated between a gate electrode and the contact plugs, and thus, a current delay may occur.

SUMMARY

The example embodiments of the inventive concept are directed to providing a semiconductor device in which generation of parasitic capacitance is reduced and which has improved operating characteristics.

According to example embodiments, there is provided a semiconductor device including active fins extending in a first direction on a substrate, isolation layers on sides of the active fins, a gate structure formed to cross the active fins and the isolation layers and extending in a second direction that is perpendicular to the first direction, source/drain regions on the active fins on sidewalls of the gate structure, a first interlayer insulating layer on the isolation layers and formed in contact with first portions of the sidewalls of the gate structure and a first surface of the source/drain regions, an etch stop layer on the first interlayer insulating layer, a second portion of the sidewalls of the gate structure, and a second surface of the source/drain regions, and contact plugs formed to pass through the etch stop layer to be in contact with the source/drain regions, wherein the source/drain regions have main growth portions in contact with the upper surfaces of the active fins and merged growth portions in which edges of the main growth portions are merged into each other.

According to example embodiments, there is provided a semiconductor device including: active fins extending in a first direction on a substrate, isolation layers on both sides of the active fins, a gate structure formed to cross the active fins and the isolation layers and extend in a second direction that is perpendicular to the first direction, source/drain regions on the active fin at both sides of the gate structure, etch stop layers on sidewalls of the gate structure and the source/drain regions and have a sigma (Σ) shape, a first interlayer insulating layer interposed between the etch stop layers, and contact plugs formed to pass through the etch stop layer and contacting the source/drain regions.

According to example embodiments, there is provided a semiconductor device including: active fins to extend in a first direction on a substrate, isolation layers on both sides of the active fins, a gate structure formed to cross the active fins and the isolation layers and extending in a second direction, source/drain regions on the active fins on sidewalls of the gate structure, a lower etch stop layer configured to cover the isolation layers, the source/drain regions, and the sidewalls of the gate structure, a first interlayer insulating layer on the lower etch stop layer and having a height less than that of an upper end of the source/drain regions, an upper etch stop layer on a portion of the lower etch stop layer and the first interlayer insulating layer, and contact plugs formed to pass through the lower etch stop layer and the upper etch stop layer and contacting an upper surface of the source/drain regions, wherein a center line of a first one of the contact plugs is misaligned with a center line of the source/drain region in the second direction.

BRIEF DESCRIPTION OF THE DRAWINGS

Example embodiments of the present disclosure will be more clearly understood from the following detailed description taken in conjunction with the accompanying drawings.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Figure 1:
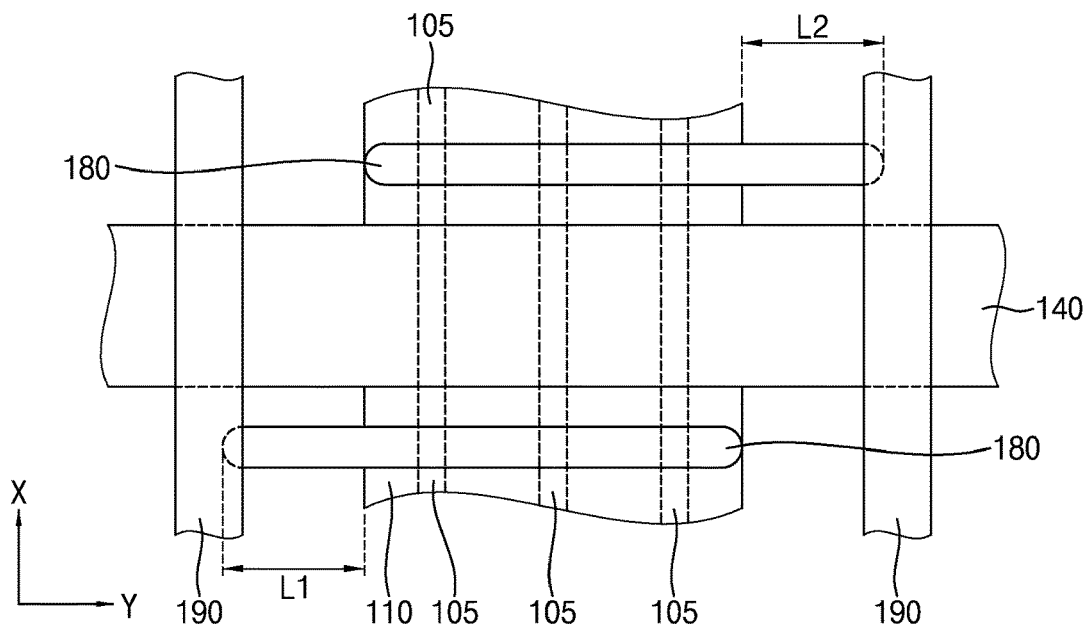
FIG. 1 is a schematic layout illustrating a semiconductor device according to example embodiments of the present inventive concept.
Figure 2:
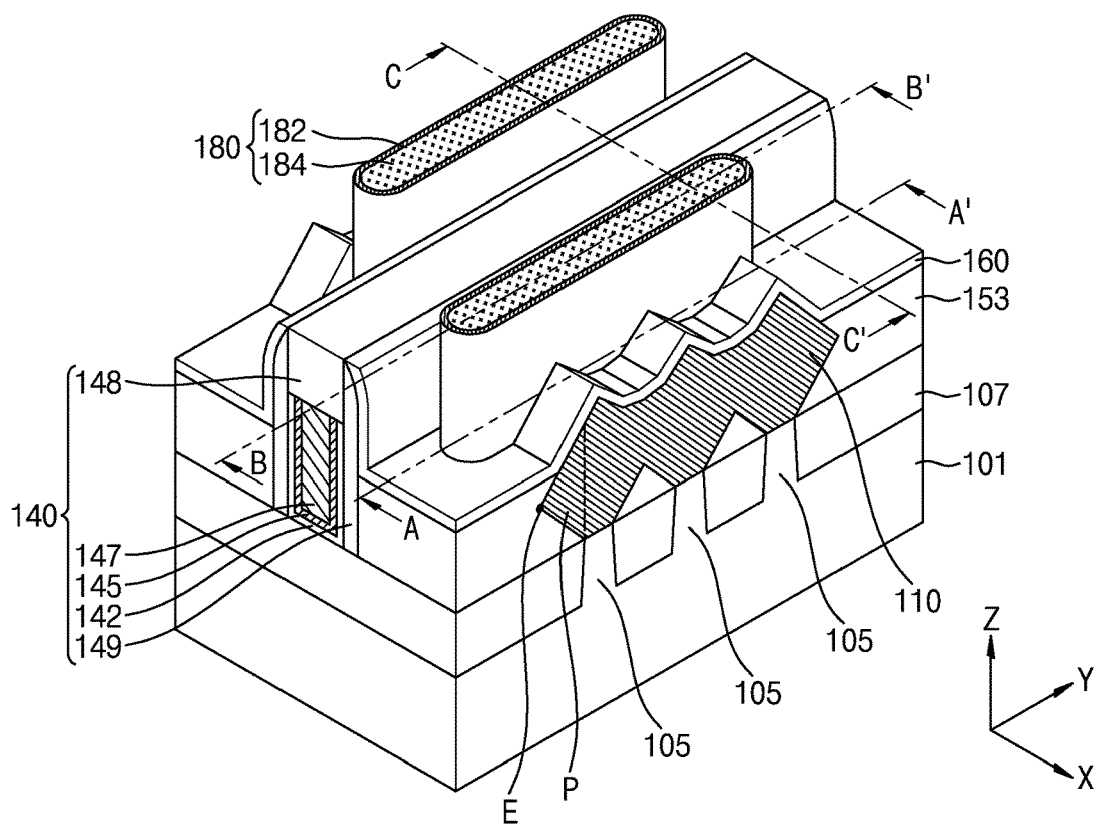
FIG. 2 is a perspective view illustrating the semiconductor device according to example embodiments of the present inventive concept.
Figure 3A:
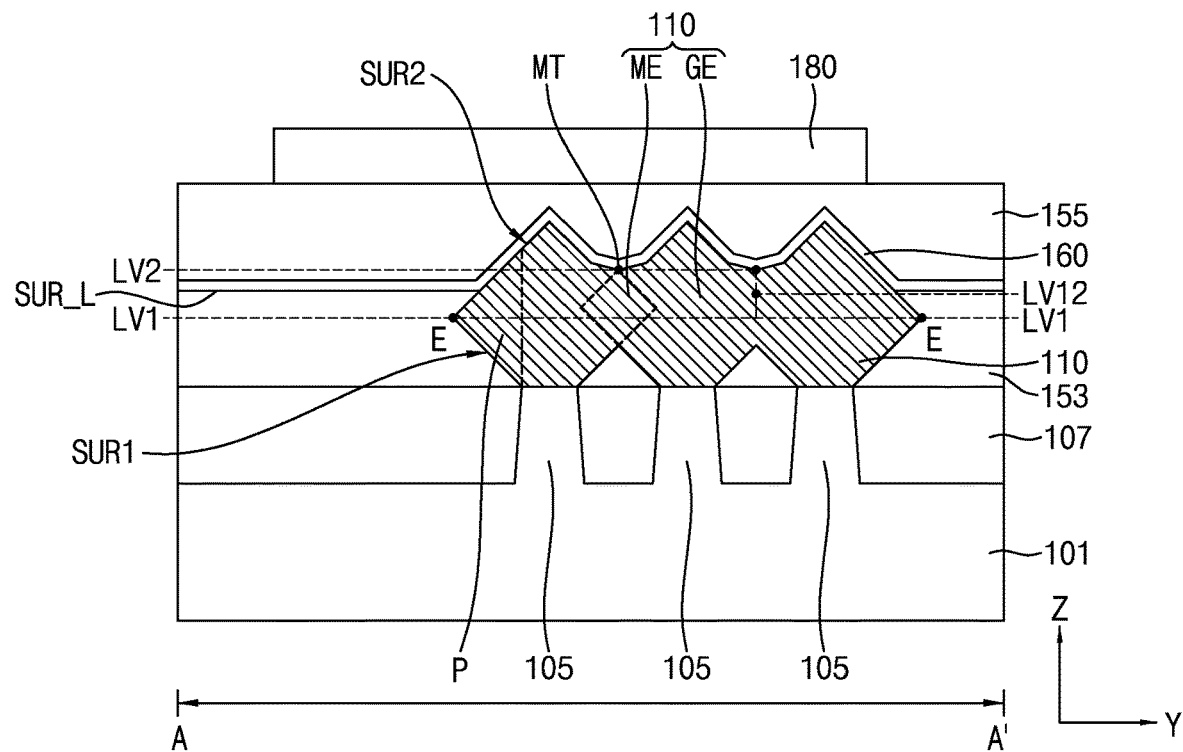
FIG. 3A is a cross-sectional view taken along line A-A' of FIG. 2 according to example embodiments of the present inventive concept.
Figure 3B:
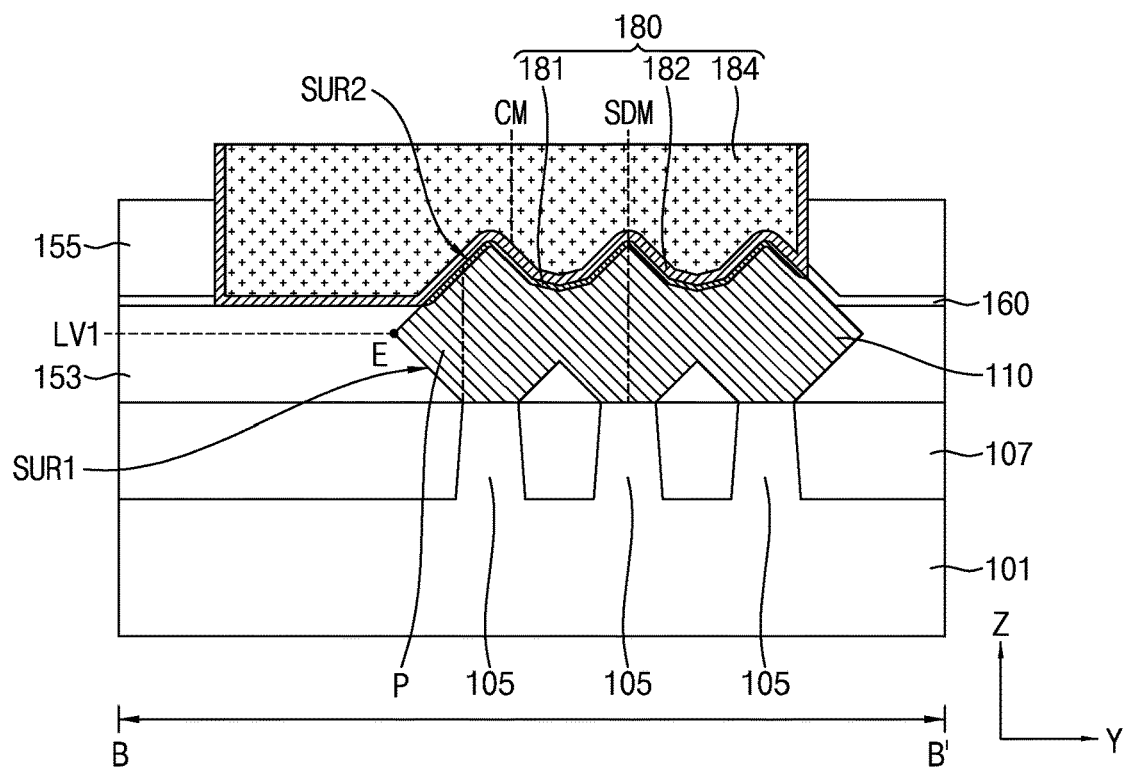
FIG. 3B is a cross-sectional view taken along line B-B' of FIG. 2 according to example embodiments of the present inventive concept.
Figure 3C:
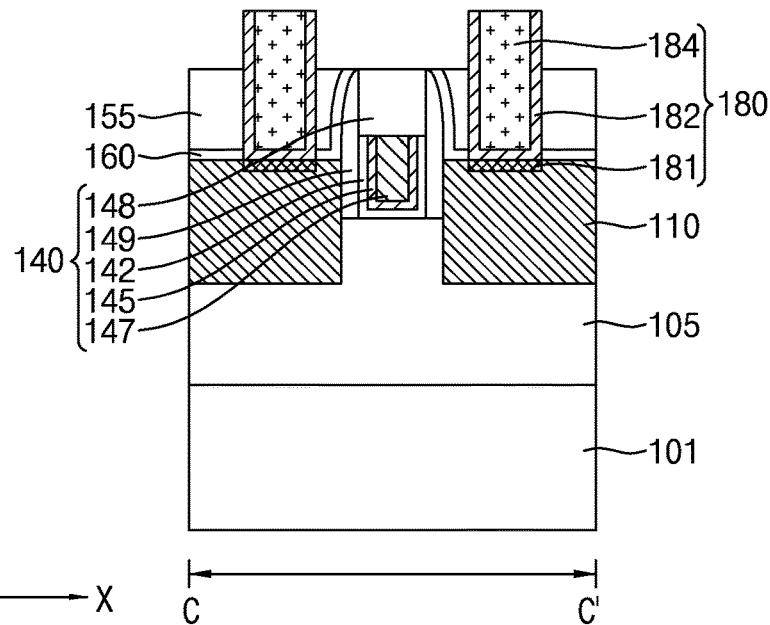
FIG. 3C is a cross-sectional view taken along line C-C' of FIG. 2 according to example embodiments of the present inventive concept.
Figure 4:
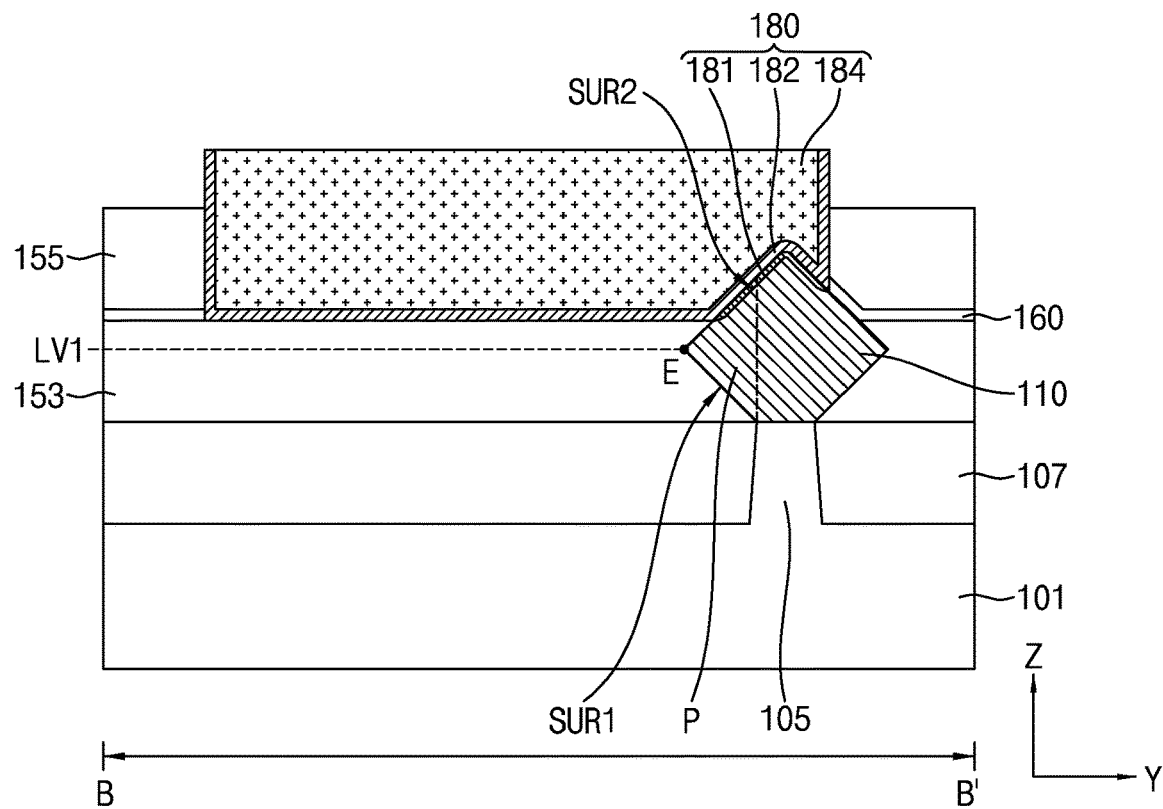
FIG. 4 is a cross-sectional view taken along line B-B' according to example embodiments of FIG. 2.

FIG. 1 is a schematic layout illustrating a semiconductor device according to some embodiments of the inventive concept. FIG. 2 is a perspective view illustrating the semiconductor device according to some embodiments of the incentive concept. FIG. 3A is a cross-sectional view taken along line A-A' of FIG. 2. FIG. 3B is a cross-sectional view taken along line B-B' of FIG. 2. FIG. 3C is a cross-sectional view taken along line C-C' of FIG. 2. FIG. 4 is a cross-sectional view taken along line B-B' according to some embodiments of FIG. 2. For convenience of description, only major elements are illustrated in FIG. 1, and a second interlayer insulating layer and upper contact plugs will be omitted in FIG. 2.

Referring to FIGS. 1 to 4, a semiconductor device 100 may include a substrate 101, active fins 105, an isolation layer 107, source/drain regions 110, a gate structure 140, a first interlayer insulating layer 153, an etch stop layer 160, the second interlayer insulating layer 155, contact plugs 180, and the upper contact plugs 190. The semiconductor device 100 according to some embodiments of the inventive concept may be a transistor such as a fin field effect transistor (fin-FET) in which the active fins 105 have a fin structure. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

The substrate 101 may have an upper surface extending in an X direction (first direction) and a Y direction (second direction). The substrate 101 may include a semiconductor material, for example, a IV group semiconductor, a III-V group compound semiconductor, or a II-VI group oxide semiconductor. For example, the IV group semiconductor may include silicon, germanium, or silicon germanium. The substrate 101 may include a bulk wafer, an epitaxial layer, a silicon-on-insulator (SOI) layer, a semiconductor-on-insulator (SeOI) layer, or the like.

The active fins 105 may be formed in a fin structure protruding from a main surface of the substrate 101. The active fins 105 may be disposed to extend in the Y direction (second direction). The active fins 105 may be formed from a portion of the substrate 101 or may include an epitaxial layer grown from the substrate 101. However, the active fins 105 on the substrate 101 may be recessed and the source/drain regions 110 may be disposed on side surfaces of the gate structure 140.

The isolation layer 107 may define the active fins 105 on the substrate 101. The isolation layer 107 may be disposed on both sides of the active fins 105 on the substrate 101. The isolation layer 107 may be made of an insulating material. For example, the isolation layer 107 may be formed through a shallow trench isolation (STI) process. The isolation layer 107 may include, for example, one selected from an oxide, a nitride, and/or a combination thereof.

The source/drain regions 110 may be disposed on one or more of the active fins the active fins 105 on both sides of the gate structure 140. The source/drain regions 110 may be provided as a source region or a drain region of the semiconductor device 100. In some embodiments, the source/drain regions 110 may have an elevated source/drain shape of which an upper surface is disposed at a higher level than a lower surface of the gate structure 140, but the inventive concept is not limited thereto. In some embodiments of the inventive concept, the source/drain regions 110 are illustrated as having a pentagonal shape. However, the source/drain regions 110 may have various shapes, for example, any one of a polygonal shape, a circular shape, and/or a rectangular shape.

The source/drain regions 110 may be configured to be connected or merged into each other on the active fins 105. In some embodiments of the inventive concept, the source/drain regions 110 are illustrated as being configured to be connected to each other on three active fins 105, but the inventive concept is not limited thereto. For example, the source/drain regions 110 may be configured to be connected to each other on two active fins 105. In some embodiments, as shown in FIG. 4, the source/drain region 110 may be formed on one active fin 105. The source/drain regions 110 may include, for example, silicon (Si) or silicon germanium (SiGe).

The source/drain regions 110 may have a main growth portion GE and a merged growth portion ME. The main growth portion GE may be a portion which is crystal-grown from a recessed region of each of the active fins 105. The merged growth portion ME may be a portion in which edges of the main growth portions GE are merged into each other. While a crystallization process proceeds, adjacent edges of the main growth portions GE may be merged and the merged portion may vertically extend to form the merged growth portion ME.

The source/drain regions 110 may have a lateral protrusion P and a lateral protrusion end E. The lateral protrusion P may be a portion which protrudes from the source/drain region 110 in an outward direction of the active fins 105. For example, the lateral protrusion end E may be a point at which a horizontal distance between the lateral protrusion P and the active fin 105 is maximized. The lateral protrusion P and the lateral protrusion end E may be formed on both sides of the source/drain regions 110.

The source/drain regions 110 may have a first surface SUR1 and a second surface SUR2. The first surface SUR1 may be located on a lower portion of the source/drain regions 110 with respect to the lateral protrusion end E and may be formed to be inclined with respect to an upper surface of the substrate 101. The first surface SUR1 may extend from a lower surface of the source/drain regions 110 in an outward and upward direction of the source/drain regions 110. The second surface SUR2 may be located on an upper portion of the source/drain regions 110 with respect to the lateral protrusion end E. The second surface SUR2 may be uneven. The second surface SUR2 may have a wave shape. The second surface SUR2 may be in contact with the first surface SUR1 to form the lateral protrusion end E. An upper end MT of the merged growth portion ME may be located on the second surface SUR2. For example, a lowermost end of a valley region of the second surface SUR2, which is disposed between the active fins 105, may correspond to the upper end MT of the merged growth portion ME.

The gate structure 140 may be disposed to cross the active fins 105 on upper portions of the active fins 105. The gate structure 140 may include a gate insulating layer 142, a first gate electrode 145, a second gate electrode 147, a gate capping layer 148, and spacers 149.

The gate insulating layer 142 may be disposed between the active fins 105 and the first and second gate electrodes 145 and 147. The gate insulating layer 142 may include an oxide, a nitride, or a high-k dielectric material. The high-k dielectric material may mean a dielectric material having a dielectric constant higher than that of a silicon oxide film ($SiO_2$). The high-k dielectric material may be, for example, any one selected from aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$). In some embodiments, the gate insulating layer 142 may be formed only on lower surfaces of the first and second gate electrodes 145 and 147.

The first gate electrode 145 and the second gate electrode 147 may be sequentially disposed on the gate insulating layer 142. When the semiconductor device 100 is a transistor, a channel region may be formed in the active fins 105 which cross the first and second gate electrodes 145 and 147. The first and second gate electrodes 145 and 147 may be made of different materials. The first gate electrode 145 may include, for example, a metal nitride film such as a titanium nitride (TiN) film, a tantalum nitride (TaN) film, or a tungsten nitride (WN) film. The second gate electrode 147 may include, for example, a metal material such as aluminum (Al), tungsten (W), or molybdenum (Mo), or a semiconductor material such as doped polysilicon. The first gate electrode 145 may function as a diffusion break layer with respect to the second gate electrode 147, but the inventive concept is not limited thereto. In some embodiments, the gate structure 140 may include a gate electrode including a single layer, or may include gate electrodes including three or more layers.

The gate capping layer 148 may be disposed on the gate insulating layer 142, the first gate electrode 145, and the second gate electrode 147. An upper surface of the gate capping layer 148 may be substantially coplanar with an upper surface of the spacer 119. For example, the gate capping layer 148 may include at least one of a silicon nitride film and a silicon oxynitride film, but the inventive concept is not limited thereto. In addition, in some embodiments, the gate capping layer 148 will be omitted as needed.

The spacers 149 may be disposed on both sides of the gate capping layer 148, the first gate electrode 145, and the second gate electrode 147. The spacers 149 may be disposed in contact with sidewalls of the gate insulating layer 142. The spacers 149 may insulate the source/drain regions 110 and the first and second gate electrodes 145 and 147. The spacers 149 may be made of at least one selected from an oxide, a nitride, and an oxynitride, and may be composed of a multi-layered film.

The first interlayer insulating layer 153 may be disposed on the isolation layer 107 and may be in contact with portions of surfaces of the source/drain region 110 and portions of sidewalls of the gate structure 140. The first interlayer insulating layer 153 may be in contact with the first surface SUR1 and a portion of the second surface SUR2 of the source/drain regions 110. A height of the first interlayer insulating layer 153 may be less than that of the source/drain regions 110. The height of the first interlayer insulating layer 153 may be greater than that of a corner E of the source/drain regions 110 and be less than that of the upper end MT of the merged growth portion ME. The first interlayer insulating layer 153 may be made of an insulating material and may include at least one of an oxide layer, a nitride layer, and/or an oxynitride layer. For example, the first interlayer insulating layer 153 may be a tonen silazene (TOSZ) film or a tetraethylortho silicate (TESO) film.

The etch stop layer 160 may cover an upper surface of the first interlayer insulating layer 153, the surfaces of the source/drain regions 110 except for regions in which the contact plugs 180 are disposed, and side surfaces of the gate structure 140. The etch stop layer 160 may be used to detect an etch endpoint in a process of etching a portion of the first interlayer insulating layer 153 so as to form the contact plugs 180. For example, the etch stop layer 160 may be made of silicon nitride ($Si_3N_4$).

The etch stop layer 160 may have a flat lower surface SUR_L in contact with the upper surface of the first interlayer insulating layer 153 and a wave-shaped lower surface in contact with an upper surface of the source/drain regions 110. In some embodiments, the flat lower surface SUR_L may be disposed at a level higher than a level LV1 of the corner E of the source/drain regions 110. In addition, the flat lower surface SUR_L may be disposed at a level lower than a level LV2 of the upper end MT of the merged growth portion ME of the source/drain regions 110. In some embodiments, the flat lower surface SUR_L may be disposed at a level which matches or is higher than a midpoint between the level LV1 of the corner E of the source/drain regions 110 and the level LV2 of the upper end MT of the merged growth portion ME, and matches or is lower than the level LV2 of the upper end MT of the merged growth portion ME.

The second interlayer insulating layer 155 may cover the etch stop layer 160. The second interlayer insulating layer 155 may be made of the same material as the first interlayer insulating layer 153, but the inventive concept is not limited thereto.

The contact plugs 180 may pass through the first interlayer insulating layer 153, the etch stop layer 160, and the second interlayer insulating layer 155 and may be disposed on the source/drain regions 110. The contact plugs 180 may electrically connect the source/drain regions 110 and the upper contact plugs 190. For example, the contact plugs 180 may have an elongated shape when viewed from above.

In some embodiments, the contact plugs 180 may be disposed such that a center line CM thereof is misaligned with a center line SDM of the source/drain region 110 on the X axis. The center line CM of the contact plugs 180 may be a line passing perpendicularly through a center point of the contact plugs 180 on an X-Y plane. The center line CDM of the source/drain regions 110 may be a line passing perpendicularly through a center point of the source/drain regions 110 on the X-Y plane. The contact plugs 180 may have a shape extending in an extension direction of the gate structure 140, i.e., the X direction (first direction) and may have a shape such as a rectangular shape or an oval shape.

In some embodiments, one end of the contact plug 180 disposed near one sidewall of the gate structure 140 may extend outward from one end of the source/drain region 110 by a first length L1, and the other end thereof may be disposed on the source/drain regions 110. One end of the contact plug 180 disposed near the other sidewall of the gate structure 140 may be disposed on the source/drain regions 110, and the other end thereof may extend outward from the other end of the source/drain region 110 by a second length L2. However, the inventive concept is not limited thereto, and the contact plugs 180 disposed on both sides of the gate structure 140 may extend in the same direction according to an arrangement of the upper contact plugs 190. The first and second lengths L1 and L2 may be variously changed. The first length L1 and the second length L2 may be determined such that the contact plugs 180 are connected to the upper contact plugs 190 each disposed on one side of each of the source/drain regions 110. In FIG. 1, the contact plugs 180 are disposed on both sides of the gate structure 140, but the inventive concept is not limited thereto. The contact plugs 180 may be disposed only on one side of the gate structure 140.

A lower surface of the contact plugs 180 may be uneven along a shape of the upper surface of the source/drain regions 110. That is, the contact plugs 180 may have a wave-shaped lower surface. Since the contact plugs 180 have the uneven lower surface, a contact area with the source/drain regions 110 may be increased.

The contact plugs 180 may include a silicide layer 181, a barrier layer 182, and a conductive layer 184. The silicide layer 181 may be disposed between the source/drain region 110 and the barrier and conductive layers 182 and 184. The silicide layer 181 may be a layer formed by siliciding the source/drain regions 110 in contact with the contact plug 180, and may be omitted in some embodiments. For example, the silicide layer 181 may have a composition represented by $MSi_xD_y$. Here, M may be a metal, and D may be an element of a component different from M and Si. M may be one selected from Ti, Co, Ni, Ta, Pt, and/or combinations thereof, and D may be one selected from Ge, C, Ar, Kr, Xe, and/or combinations thereof.

The barrier layer 182 may function as a diffusion break layer with respect to a metal material constituting the conductive layer 184. The barrier layer 182 may be formed along upper portions of the source/drain regions 110 and sidewalls of the contact plugs 180. The barrier layer 182 may be a conductive metal nitride film. For example, the barrier layer 182 may be made of one selected from TiN, TaN, AlN, WN, and/or combinations thereof. The conductive layer 184 may be formed on the barrier layer 182. The conductive layer 184 may include a conductive material such as Al, Cu, W, and/or Mo.

In some embodiments, the upper contact plug 190 may be an interconnection line. When the upper contact plug 190 is the interconnection line, a metal via may be formed between the contact plug 180 and the interconnection line.

Figure 5:
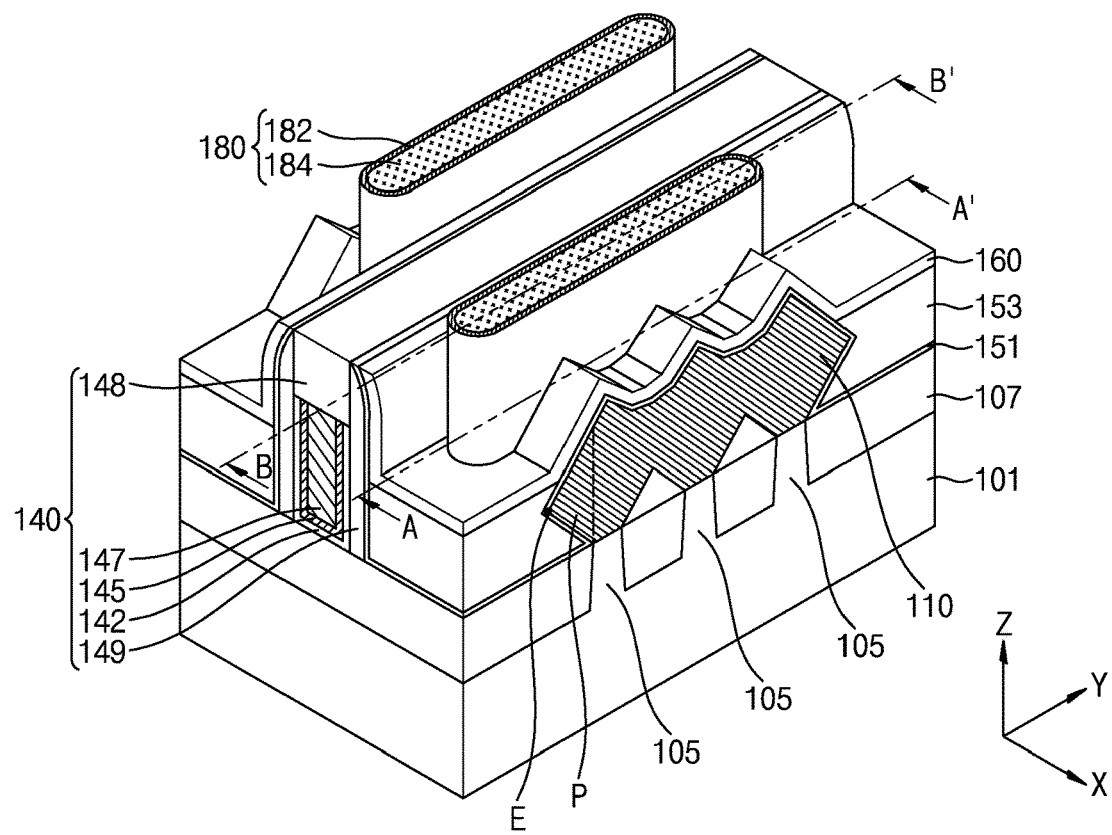
FIG. 5 is a perspective view illustrating a semiconductor device according to example embodiments of the present inventive concept.
Figure 6A:
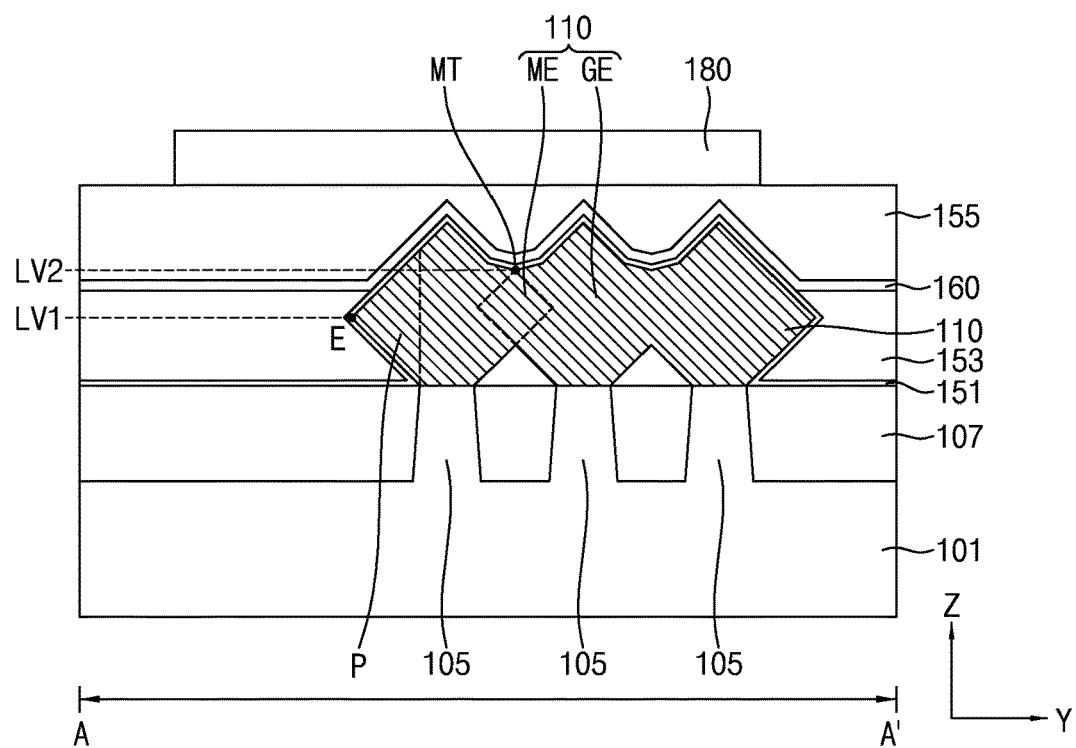
FIG. 6A is a cross-sectional view taken along line A-A' of FIG. 5 according to example embodiments of the present inventive concept.
Figure 6B:
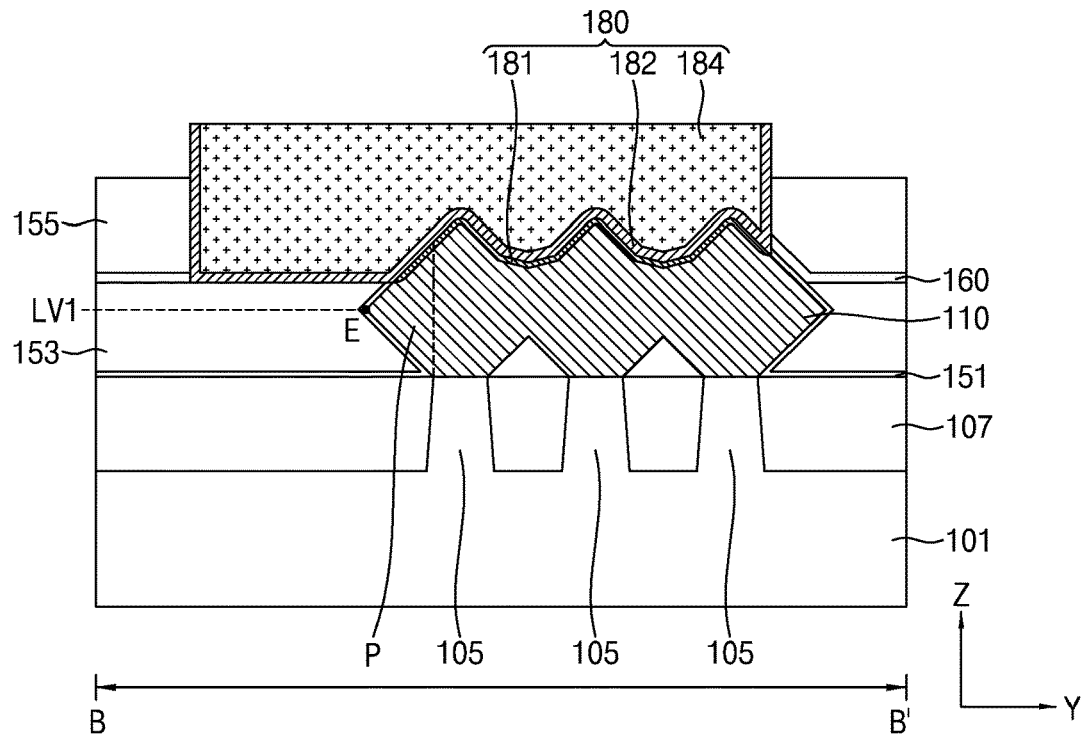
FIG. 6B is a cross-sectional view taken along line B-B' of FIG. 5 according to example embodiments of the present inventive concept.

FIG. 5 is a perspective view illustrating a semiconductor device according to some embodiments of the inventive concept. FIG. 6A is a cross-sectional view taken along line A-A' of FIG. 5. FIG. 6B is a cross-sectional view taken along line B-B' of FIG. 5. For convenience of description, a second interlayer insulating layer and upper contact plugs will be omitted in FIG. 5. Since the semiconductor device of FIGS. 5, 6A, and 6B is similar to the semiconductor device described with reference to FIGS. 1 to 4 except for an etch stop layer, descriptions thereof will be provided based on differences from the above-described contents. Hereinafter, it will be understood that like numbers refer to like elements.

Referring to FIGS. 5, 6A, and 6B, a semiconductor device 100a, according to some embodiments, may further include a protective layer 151. The protective layer 151 may cover an upper surface of an isolation layer 107, surfaces of source/drain regions 110 except for regions in which contact plugs 180 are disposed, and side surfaces of a gate structure 140. The protective layer 151 may be disposed under a first interlayer insulating layer 153 and the etch stop layer 160. For example, the protective layer 151 may be made of an oxide, but the inventive concept is not limited thereto. The protective layer 151 may protect the source/drain regions 110 from being doped with impurities. The protective layer 151 may protect the source/drain regions 110 from being recessed in a process of etching the first interlayer insulating layer 153, the second interlayer insulating layer 155, and the etch stop layer 160 so as to form the contact plugs 180.

Figure 7:
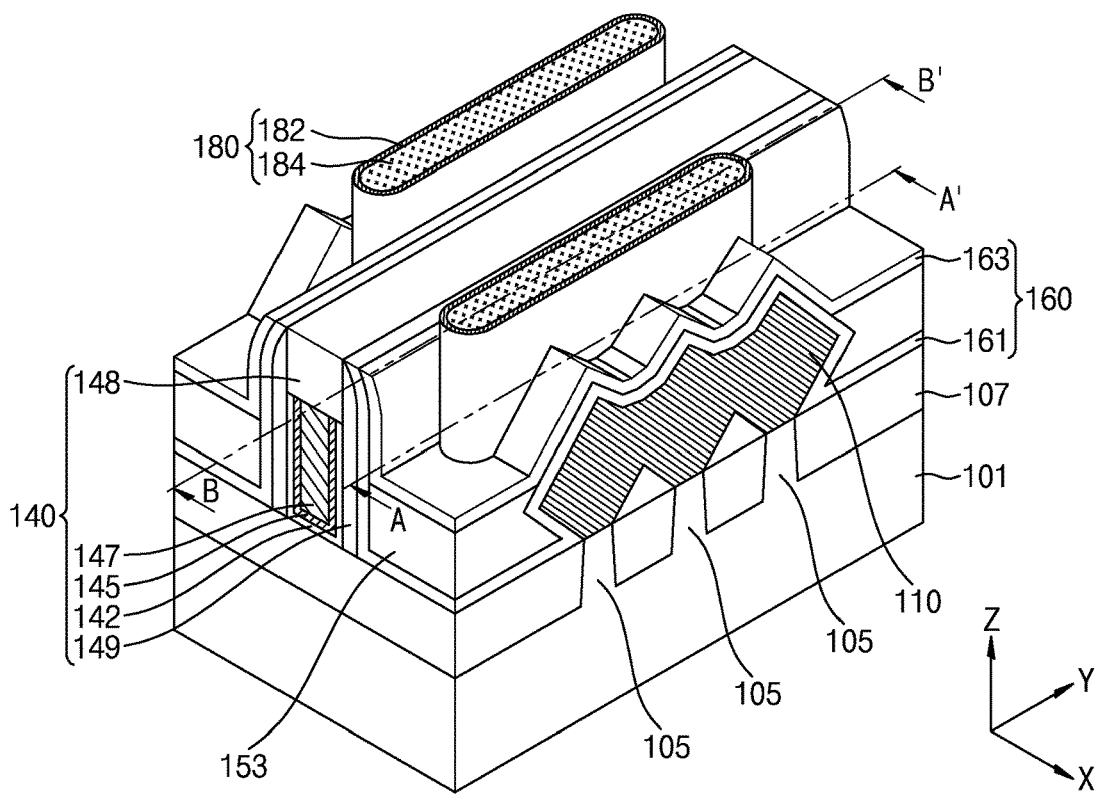
FIG. 7 is a perspective view illustrating a semiconductor device according to example embodiments of the present inventive concept.
Figure 8A:
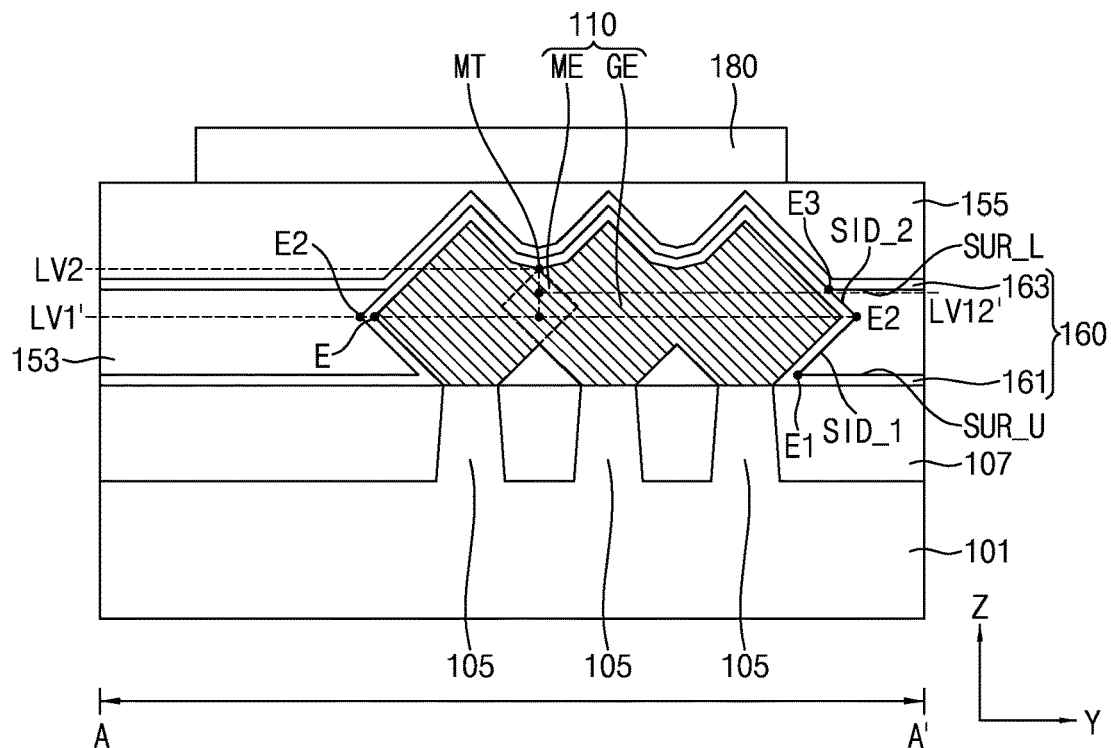
FIG. 8A is a cross-sectional view taken along line A-A' of FIG. 7 according to example embodiments of the present inventive concept.
Figure 8B:
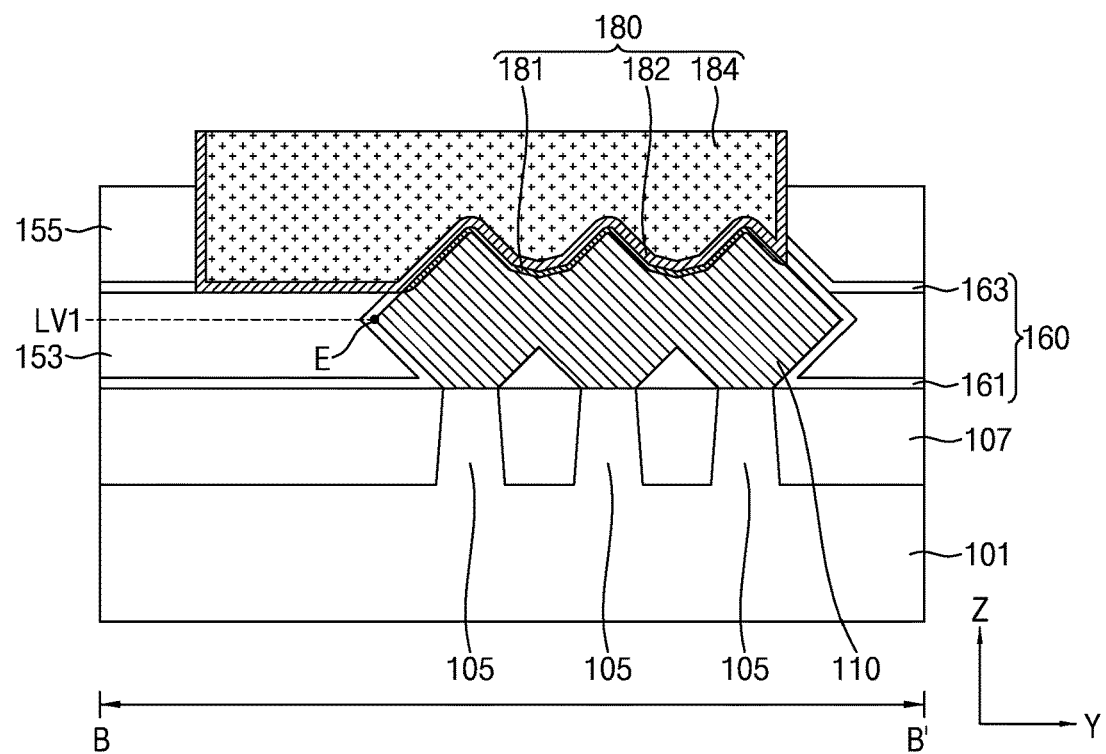
FIG. 8B is a cross-sectional view taken along line B-B' of FIG. 7 according to example embodiments of the present inventive concept.

FIG. 7 is a perspective view illustrating a semiconductor device according to some embodiments of the inventive concept. FIG. 8A is a cross-sectional view taken along line A-A' of FIG. 7. FIG. 8B is a cross-sectional view taken along line B-B' of FIG. 7. For convenience of description, a second interlayer insulating layer and upper contact plugs will be omitted in FIG. 7. Since the semiconductor device of FIGS. 7, 8A, and 8B is similar to the semiconductor device described with reference to FIGS. 1 to 4 except for an etch stop layer, descriptions thereof will be provided based on differences from the above-described contents. Hereinafter, it will be understood that like numbers refer to like elements.

Referring to FIGS. 7, 8A, and 8B, a semiconductor device 100b may include the etch stop layer 160 and a first interlayer insulating layer 153. The etch stop layer 160 may cover an isolation layer 107, source/drain regions 110, and side surfaces of a gate structure 140. The etch stop layer 160 may have a sigma ($\Sigma$)-shaped cross section at both sides of the source/drain regions 110.

The etch stop layer 160 may include a lower etch stop layer 161 and an upper etch stop layer 163. The lower etch stop layer 161 may cover the isolation layer 107, the source/drain regions 110 except for regions in which contact plugs 180 are disposed, and the side surfaces of the gate structure 140. The lower etch stop layer 161 may have a lower upper surface SUR U, a first side surface SID_1, and a second side surface SID_2. A first corner E1 may be formed between the lower upper surface SUR U and the first side surface SID_1. A second corner E2 may be formed between the first side surface SID_1 and the second side surface SID_2. For example, the second corner E2 may be disposed at a level matching a level of a corner E of the source/drain regions 110. A third corner E3 may be formed between the second side surface SID_2 and a flat lower surface SUR_L of the upper etch stop layer 163, which is in contact with an upper surface of the first interlayer insulating layer 153.

The upper etch stop layer 163 may cover the lower etch stop layer 161 and the first interlayer insulating layer 153. The upper etch stop layer 163 may be formed in contact with a portion of the lower etch stop layer 161. The upper etch stop layer 163 may be in contact with a portion of the lower etch stop layer 161 which is disposed at a higher level than the third corner E3. The etch stop layer 160 may include the upper etch stop layer 163 and the lower etch stop layer 161 at a higher level than the third corner E3. The etch stop layer 160 may include the lower etch stop layer 161 at a lower level than the third corner E3. A portion of the etch stop layer 160 disposed at a higher level than the third corner E3 may be thicker than a portion thereof disposed at a lower level that the third corner E3.

In some embodiments, the flat lower surface SUR_L of the upper etch stop layer 163 may be disposed at a higher level than the corner E of the source/drain regions 110. The flat lower surface SUR_L of the upper etch stop layer 163 may be disposed at a level higher than a level LV1' of the second corner E2. In addition, the flat lower surface SUR_L of the upper etch stop layer 163 may be disposed at a level lower than a level LV2 of an upper end MT of a merged growth portion ME of the source/drain regions 110. In some embodiments, the flat lower surface SUR_L of the upper etch stop layer 163 may be disposed at a level which matches or is higher than a midpoint LV12' between the LV1' of the second corner E2 and the level LV2 of the upper end MT of the merged growth portion ME.

A sigma (Σ) shape may be formed by connecting the lower upper surface SUR U, the first corner E1, the first side surface SID_1, the second corner E2, the second side surface SID_2, and the third corner E3 of the lower etch stop layer 16, and the flat lower surface SUR_L of the upper etch stop layer 163.

The first interlayer insulating layer 153 may be interposed between the lower etch stop layer 161 and the upper etch stop layer 163 on both sides of the source/drain regions 110. The first interlayer insulating layer 153 may cover a portion of the lower etch stop layer 161 on both sides of the source/drain regions 110. The first interlayer insulating layer 153 may be formed in contact with the first side surface SID_1 and the second side surface SID_2 of the lower etch stop layer 161. The first interlayer insulating layer 153 may have a sigma (E)-shaped surface along a surface shape of the etch stop layer 160.

Figure 9:
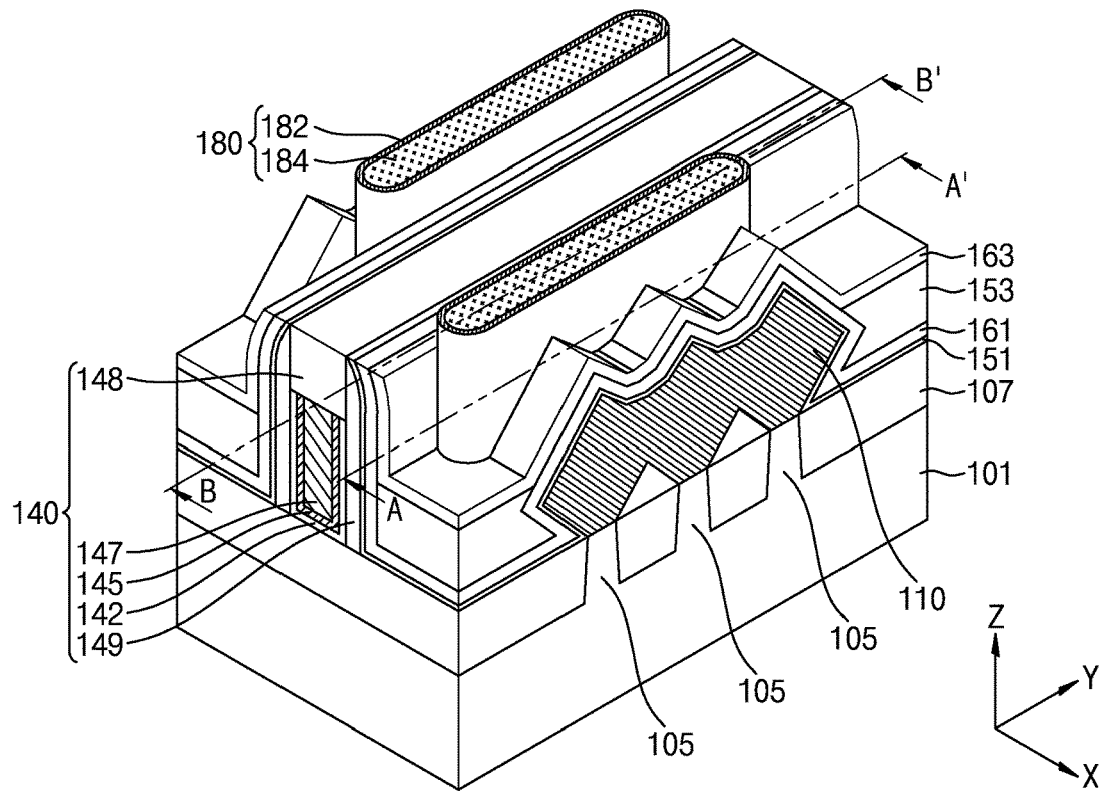
FIG. 9 is a perspective view illustrating a semiconductor device according to example embodiments of the present inventive concept.
Figure 10:
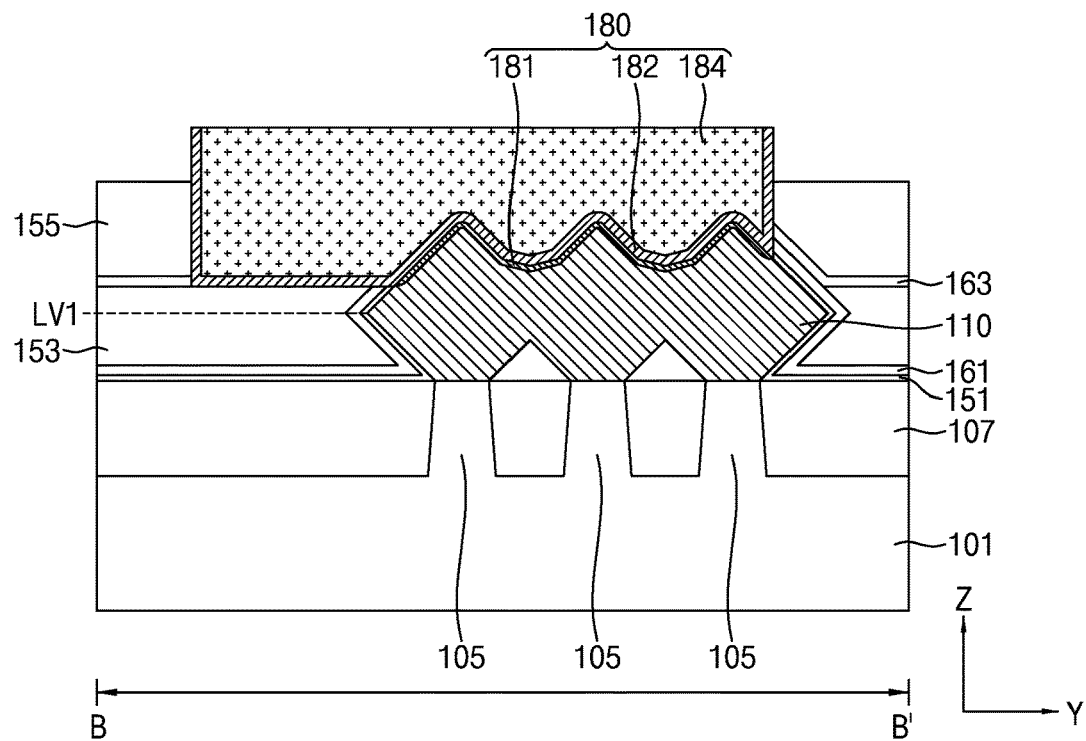
FIG. 10 is a cross-sectional view taken along line A-A' of FIG. 10 according to example embodiments of the present inventive concept.

FIG. 9 is a perspective view illustrating a semiconductor device according to some embodiments of the inventive concept. FIG. 10 is a cross-sectional view taken along line A-A' of FIG. 10. Since the semiconductor device of FIGS. 9 and 10 is similar to the semiconductor device described with reference to FIGS. 7, 8A, and 8B except for a protective layer, descriptions thereof will be provided based on differences from the above-described contents. In various embodiments described herein, it will be understood that like numbers refer to like elements.

Referring to FIGS. 9 and 10, a semiconductor device 100c may further include a protective layer 151. The protective layer 151 may be disposed on a lower portion of a lower etch stop layer 161. The protective layer 151 may cover an upper surface of an isolation layer 107, surfaces of source/drain regions 110 except for regions in which contact plugs 180 are disposed, and side surfaces of a gate structure 140. For example, the protective layer 151 may be made of an oxide, but the inventive concept is not limited thereto. The protective layer 151 may protect the source/drain regions 110 from being doped with impurities. The protective layer 151 may protect the source/drain regions 110 from being recessed in a process of etching a first interlayer insulating layer 153, a second interlayer insulating layer 155, and an etch stop layer 160 so as to form the contact plugs 180.

FIGS. 11 to 24 are views illustrating a method of manufacturing a semiconductor device according to some embodiments of the inventive concept. Like numbers refer to like elements in FIGS. 1 to 30. For the sake of brief description, descriptions of contents substantially the same as those described with reference to FIGS. 1 to 10 will be omitted.

Figure 11:
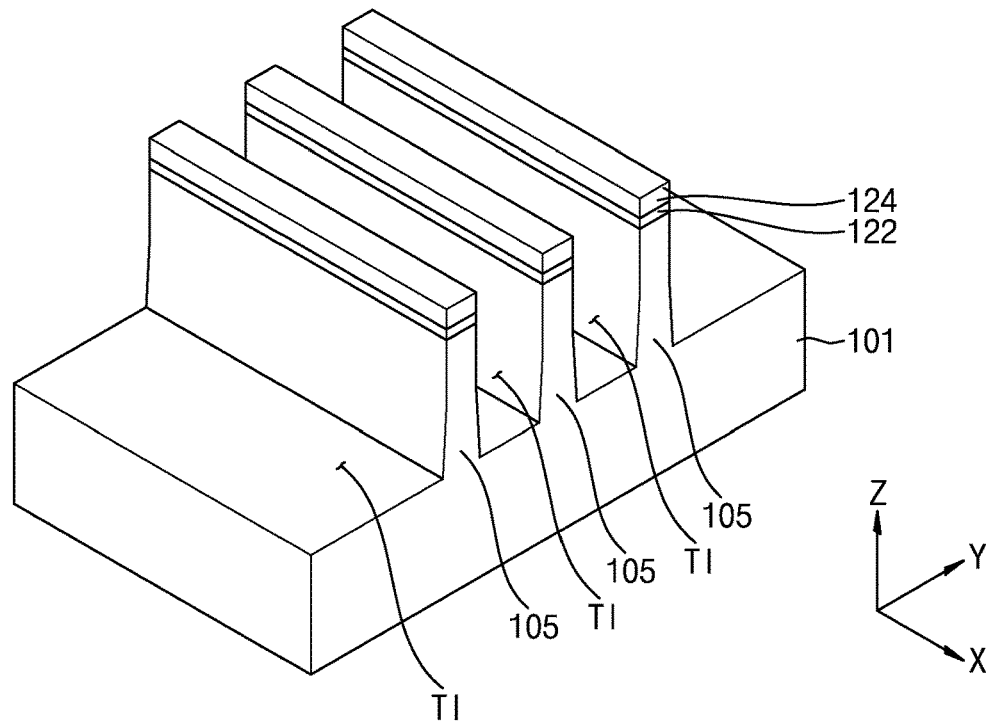
FIGS. 11 to 24 are views illustrating a method of manufacturing a semiconductor device according to example embodiments of the present inventive concept.

Referring to FIG. 11, trenches TI defining active fins 105 may be formed by patterning a substrate 101. Pad oxide patterns 122 and mask patterns 124 may be formed on the substrate 101. The pad oxide patterns 122 may be a layer for protecting upper surfaces of the active fins 105 and may be omitted in some embodiments. The mask patterns 124 may be a mask layer for patterning the substrate 101 and may include silicon nitride, a carbon-containing material, or the like. The mask patterns 124 may have a multi-layered structure.

The trenches TI may be formed by anisotropically etching the substrate 101 by using the pad oxide patterns 122 and the mask patterns 124. Since the trenches TI have a high aspect ratio, a width thereof may be gradually decreased toward a lower portion thereof. The active fins 105 may have a shape of which a width is gradually decreased toward an upper portion thereof.

Figure 12:
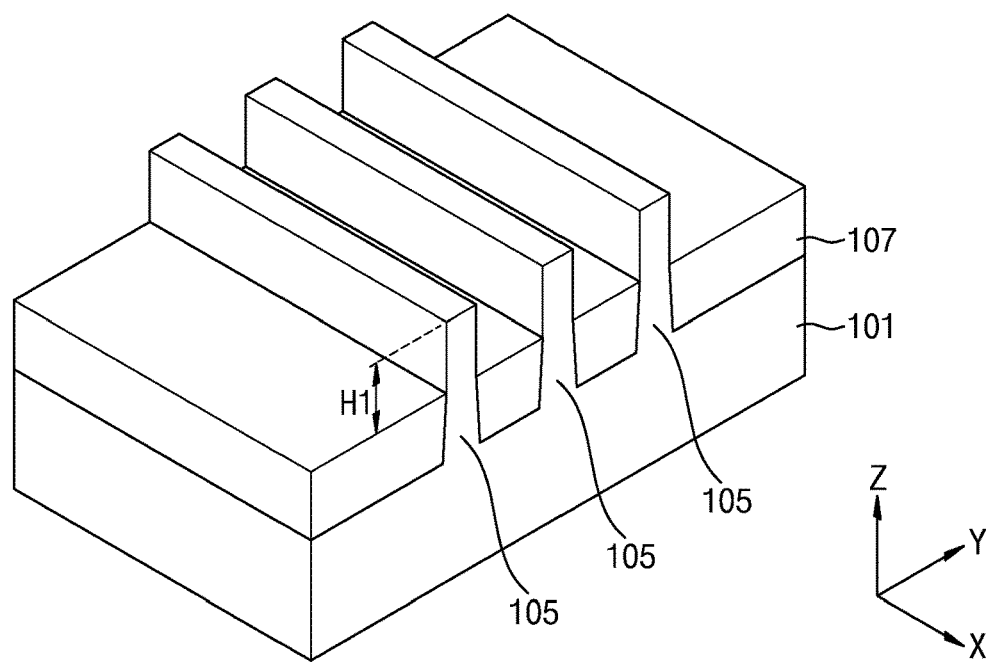

Referring to FIG. 12, an isolation layer 107 may be formed to fill the trenches TI. The isolation layer 107 may be made of an insulating material. After the isolation layer 107 fills the trenches TI, a planarization process may be performed. During the planarization process, at least a portion of each of the pad oxide patterns 122 and the mask patterns 124 may be removed. In some embodiments, after a relatively thin liner layer is precedently formed in the trenches TI, the trenches TI may be filled with the isolation layer 107.

The isolation layer 107 filling the trenches TI may be partially removed, and the active fins 105 may protrude from the substrate 101. The isolation layer 107 may be removed, for example, through a wet etching process using at least a portion of the pad oxide patterns 122 as an etching mask. The active fins 105 may protrude upward by a certain height H1, and the protrusion height H1 may be variously changed. The pad oxide patterns 122 may also be removed during etching.

Figure 13:
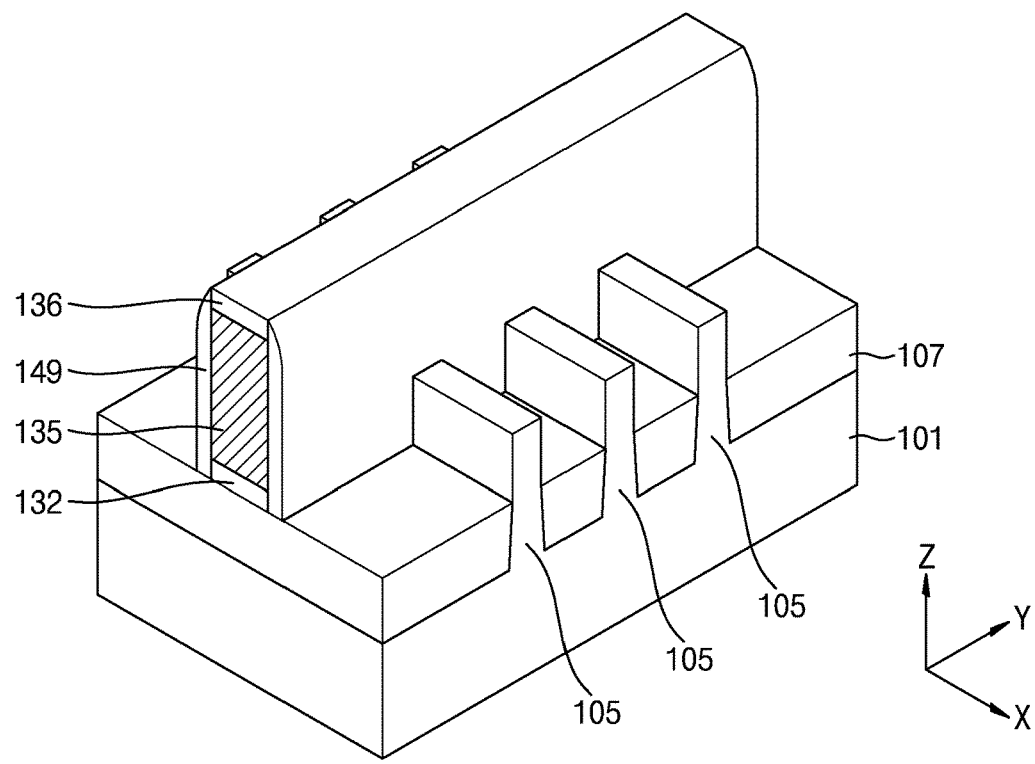

Referring to FIG. 13, a dummy gate insulating layer 132, a dummy gate electrode 135, and spacers 149 may be formed to extend and cross the active fins 105. For example, the dummy gate insulating layer 132 and the dummy gate electrode 135 may be formed through an etching process using a mask pattern layer 136.

The dummy gate insulating layer 132 and the dummy gate electrode 135 may be formed in regions in which a gate insulating layer 142 and first and second gate electrodes 145 and 147 (see FIG. 2) are to be formed. The dummy gate insulating layer 132 and the dummy gate electrode 135 may be removed during a subsequent process. For example, the dummy gate insulating layer 132 may include silicon oxide, and the dummy gate electrode 135 may include polysilicon.

The spacers 149 may be formed by forming a film having a uniform thickness on upper portions of the dummy gate insulating layer 132, the dummy gate electrode 135, and the mask pattern layer 136 and anisotropically etching the film. The spacers 149 may have a structure in which a plurality of films are stacked.

Figure 14:
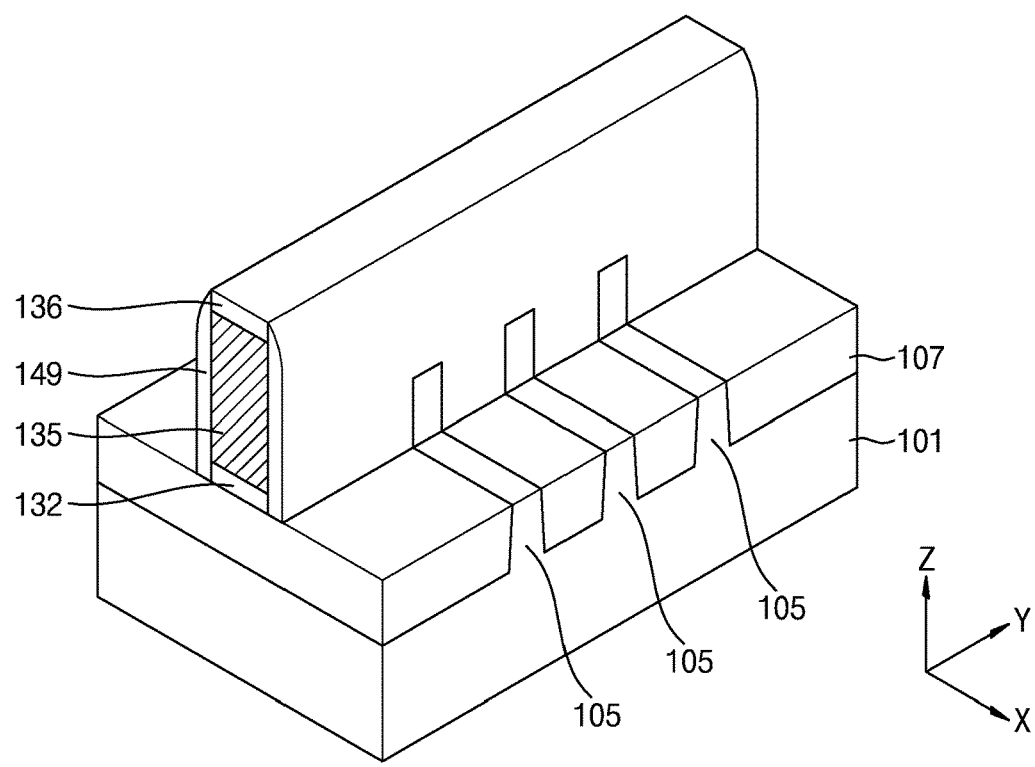

Referring to FIG. 14, the active fins 105 on both sides of the spacers 149 may be selectively removed. Recesses may be formed on both sides of the spacers 149 by removing the active fins 105. The recesses may be formed by partially etching the active fins 105 by using a separately formed mask layer (not shown) or the mask pattern layer and spacers 136 and 149 as an etching mask. For example, the recesses may be formed by sequentially performing a dry etching process and a wet etching process. Selectively, after the recesses are formed, surfaces of the recessed active fins 105 may be cured through a separate process. In some embodiments, an upper surface of the recessed active fins 105 is illustrated as being disposed at the same level as an upper surface of the isolation layer 107, but the inventive concept is not limited thereto. In some embodiments, the upper surface of the recessed active fins 105 may be disposed at a higher or lower level than the upper surface of the isolation layer 107.

Before or after the recesses are formed, a process of implanting impurities into the active fins 105 on both sides of the dummy gate electrode 135 may be performed. The process of implanting the impurities may be performed using the mask pattern layer 136 and the spacers 149 as a mask.

Figure 15:
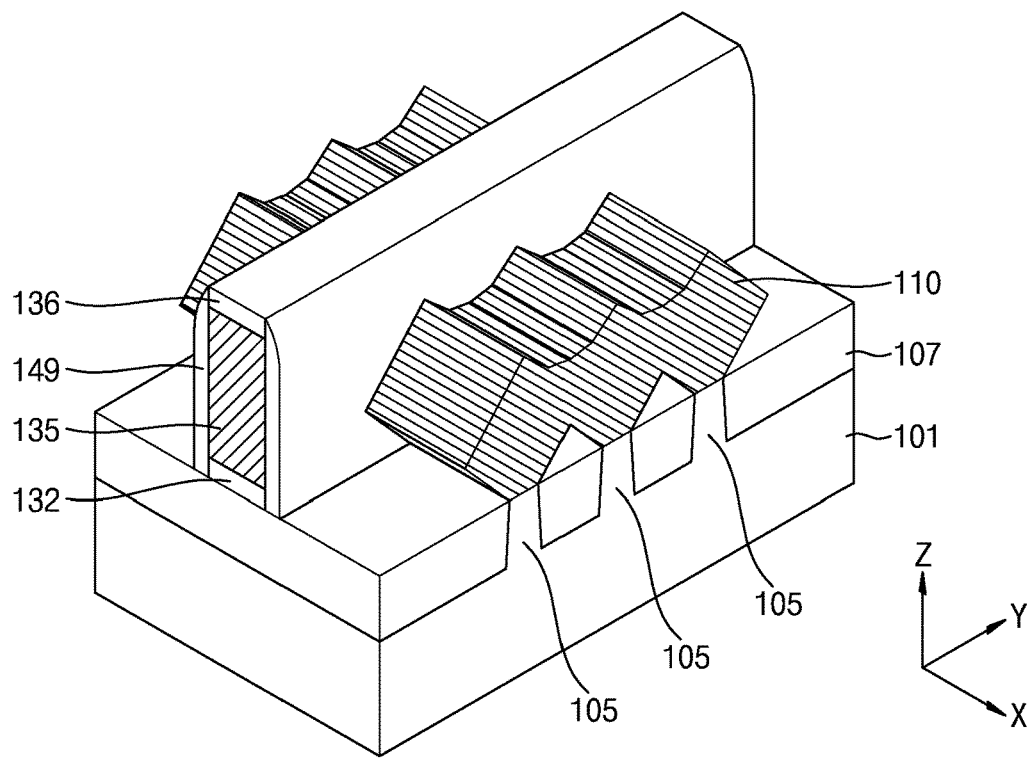

Referring to FIG. 15, source/drain regions 110 may be formed on the recessed active fins 105 on both sides of the spacers 149. For example, the source/drain regions 110 may be formed using a selective epitaxial growth (SEG) process. A merged growth portion ME may be formed while the source/drain regions 110 formed on the active fins 105 are connected to each other during growth thereof.

The source/drain regions 110 formed on the active fins 105 may include the same germanium (Ge) concentration or different Ge concentrations. The source/drain regions 110 may grow along a crystallographically stable surface during growth thereof and may have a pentagonal or hexagonal cross section along a Y-Z plane. However, the size and shape of the source/drain regions 110 are not limited to those shown in the drawings.

The source/drain regions 110 may include impurities. The impurities may be included in situ during growth of the source/drain regions 110, or may be included by separately implanting ions after the growth. The grown source/drain regions 110 may be provided as a source region or a drain region of the semiconductor device.

Figure 16:
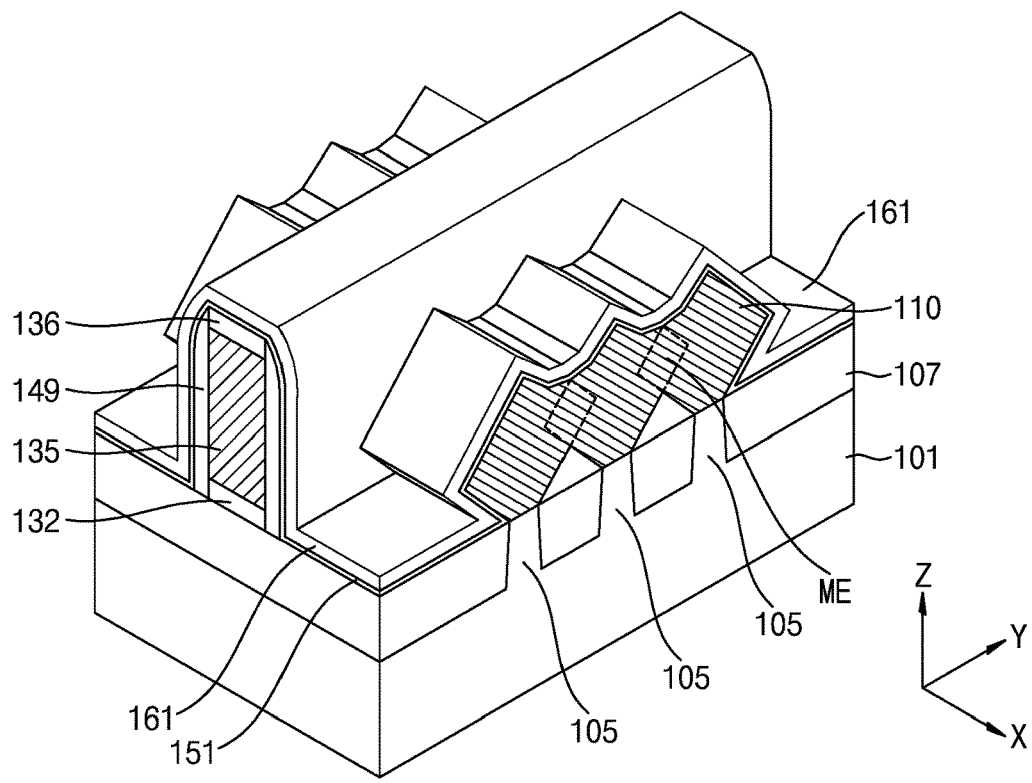

Referring to FIG. 16, a protective layer 151 may be formed to cover an upper surface of the mask pattern layer 136, side surfaces of the spacers 149, surfaces of the source/drain regions 110, and an upper surface of the isolation layer 107. For example, the protective layer 151 may be made of an oxide, but the inventive concept is not limited thereto. The protective layer 151 may protect the source/drain regions 110 from being doped with impurities. In addition, the protective layer 151 may protect the source/drain regions 110 from being recessed in a process of etching a first interlayer insulating layer 153, a second interlayer insulating layer 155, and an etch stop layer 160 (see FIGS. 5 and 9) so as to form contact plugs 180. In some embodiments, the protective layer 151 may be omitted.

A lower etch stop layer 161 may be formed on the protective layer 151. The lower etch stop layer 161 may completely cover an upper surface of the protective layer 151. For example, the lower etch stop layer 161 may be deposited through chemical vapor deposition (CVD) or atomic layer deposition (ALD).

Figure 17:
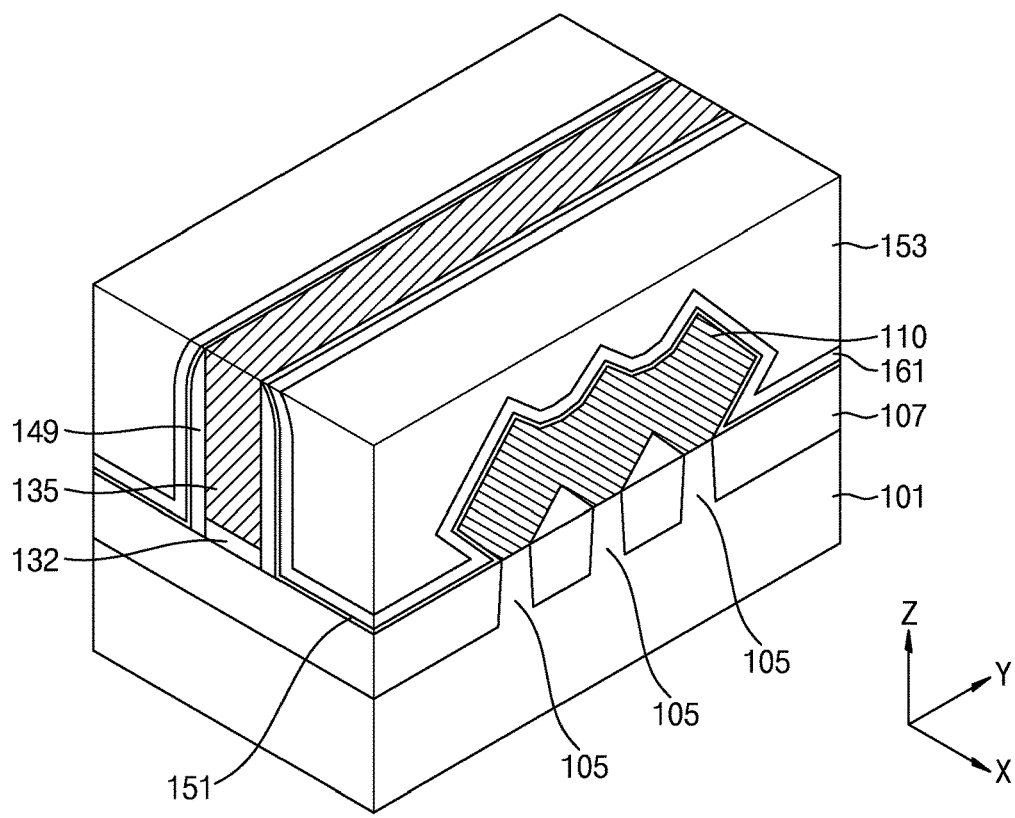

Referring to FIG. 17, the first interlayer insulating layer 153 may be formed on the lower etch stop layer 161. The first interlayer insulating layer 153 may be formed by forming an insulating material layer covering the lower etch stop layer 161 and performing a planarization process of exposing an upper surface of the dummy gate electrode 135. The protective layer 151, the lower etch stop layer 161, and the mask pattern layer 136 on the dummy gate electrode 135 may be removed during the planarization process to expose the upper surface of the dummy gate electrode 135. Alternatively, the mask pattern layer 136 may be removed in a subsequent planarization process of a second interlayer insulating layer 155.

Figure 18:
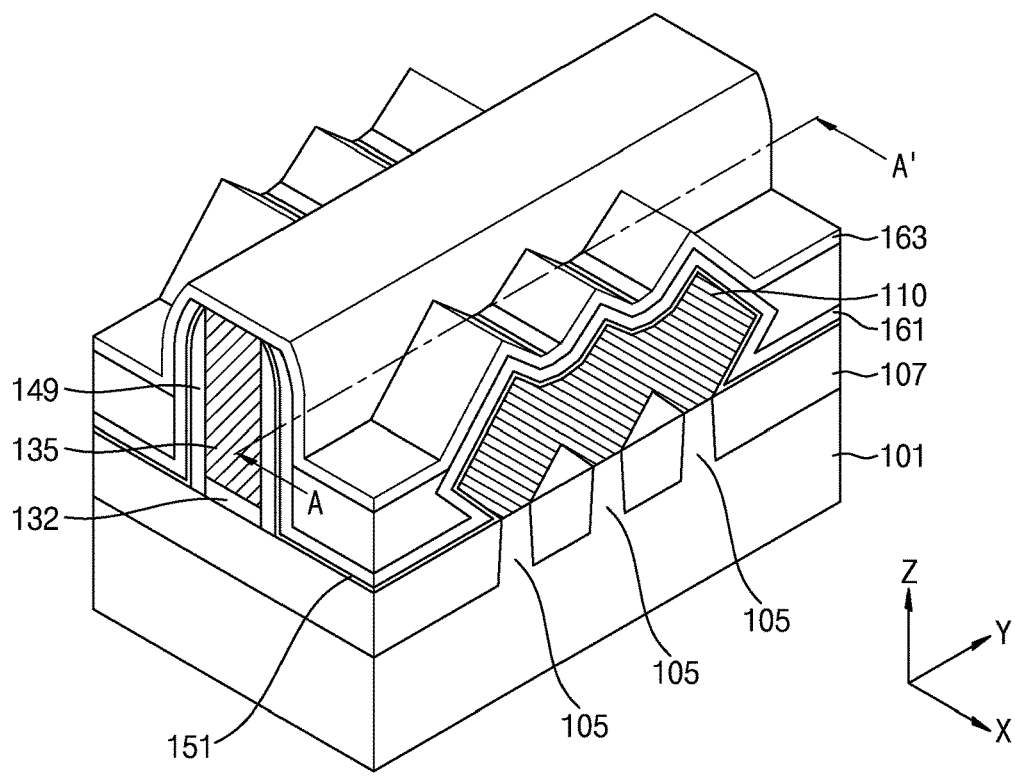
Figure 19:
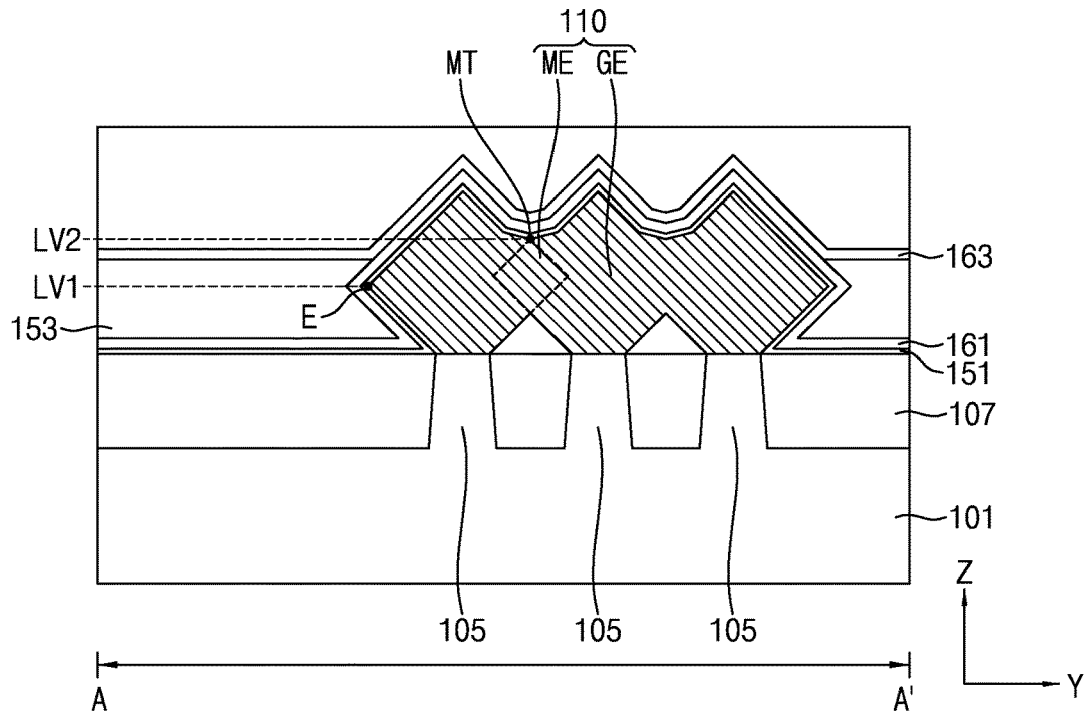

Referring to FIGS. 18 and 19, a portion of the first interlayer insulating layer 153 may be removed. The first interlayer insulating layer 153 may be selectively removed with respect to the dummy gate electrode 135, the spacers 149, and the lower etch stop layer 161 to expose portions of the spacers 149 and a portion of the lower etch stop layer 161. The first interlayer insulating layer 153 may be partially removed such that an upper surface thereof has a level which matches or is lower than an upper end MT of the merged growth portion ME of the source/drain regions 110 and is higher than a corner E of the source/drain regions 110.

An upper etch stop layer 163 may be formed to cover exposed upper portions of the spacers 149, an exposed upper portion of the lower etch stop layer 161, and the upper surface of the first interlayer insulating layer 153. The upper etch stop layer 163 may be formed in the same manner as in the lower etch stop layer 161.

Figure 20:
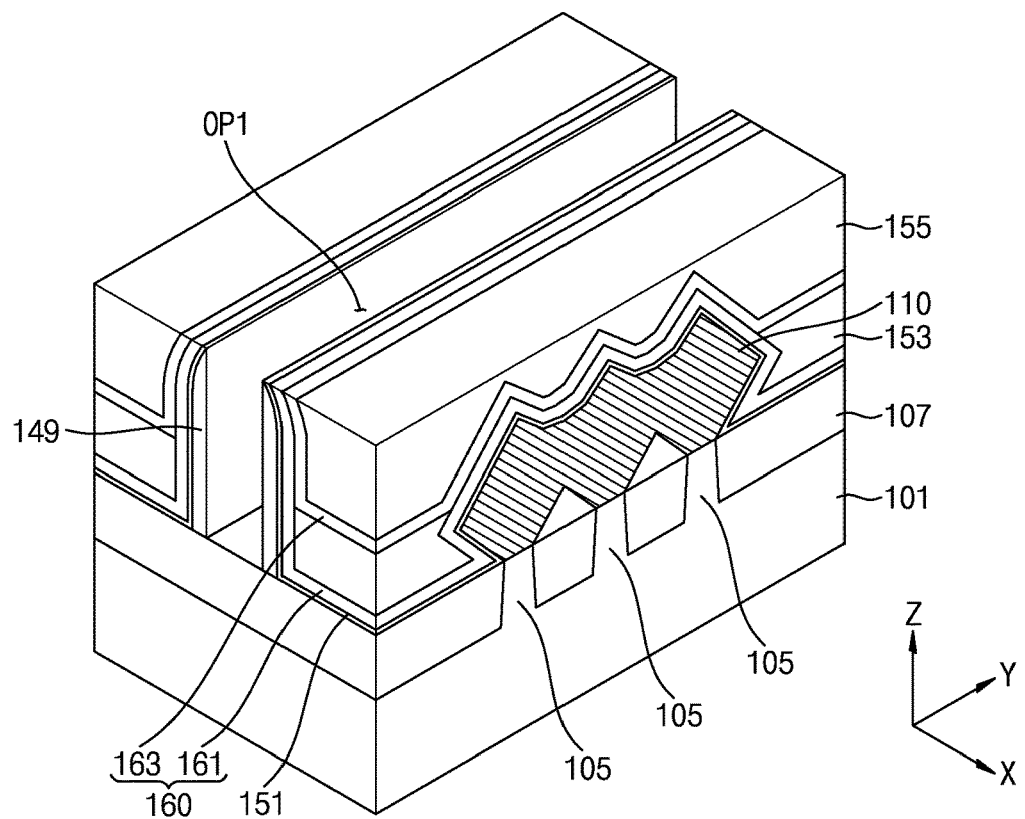

Referring to FIG. 20, the second interlayer insulating layer 155 may be formed on the upper etch stop layer 163. The second interlayer insulating layer 155 may be formed by forming an insulating material covering the upper etch stop layer 163 and performing a planarization process of exposing the upper surface of the dummy gate electrode 135. The upper etch stop layer 163 on the dummy gate electrode 135 may be removed through the planarization process to expose the upper surface of the dummy gate electrode 135. When the mask pattern layer 136 remains on the dummy gate electrode 135, the mask pattern layer 136 may be removed in the planarization process.

The dummy gate insulating layer 132 and the dummy gate electrode 135 may be removed through an exposed upper surface of the dummy gate electrode 135. The dummy gate insulating layer 132 and the dummy gate electrode 135 are selectively removed with respect to the isolation layer 107 and the active fins 105 thereunder to form a first opening OP1 for exposing the isolation layer 107 and the active fins 105. The dummy gate insulating layer 132 and the dummy gate electrode 135 may be removed through at least one of a dry etching process and a wet etching process.

Figure 21:
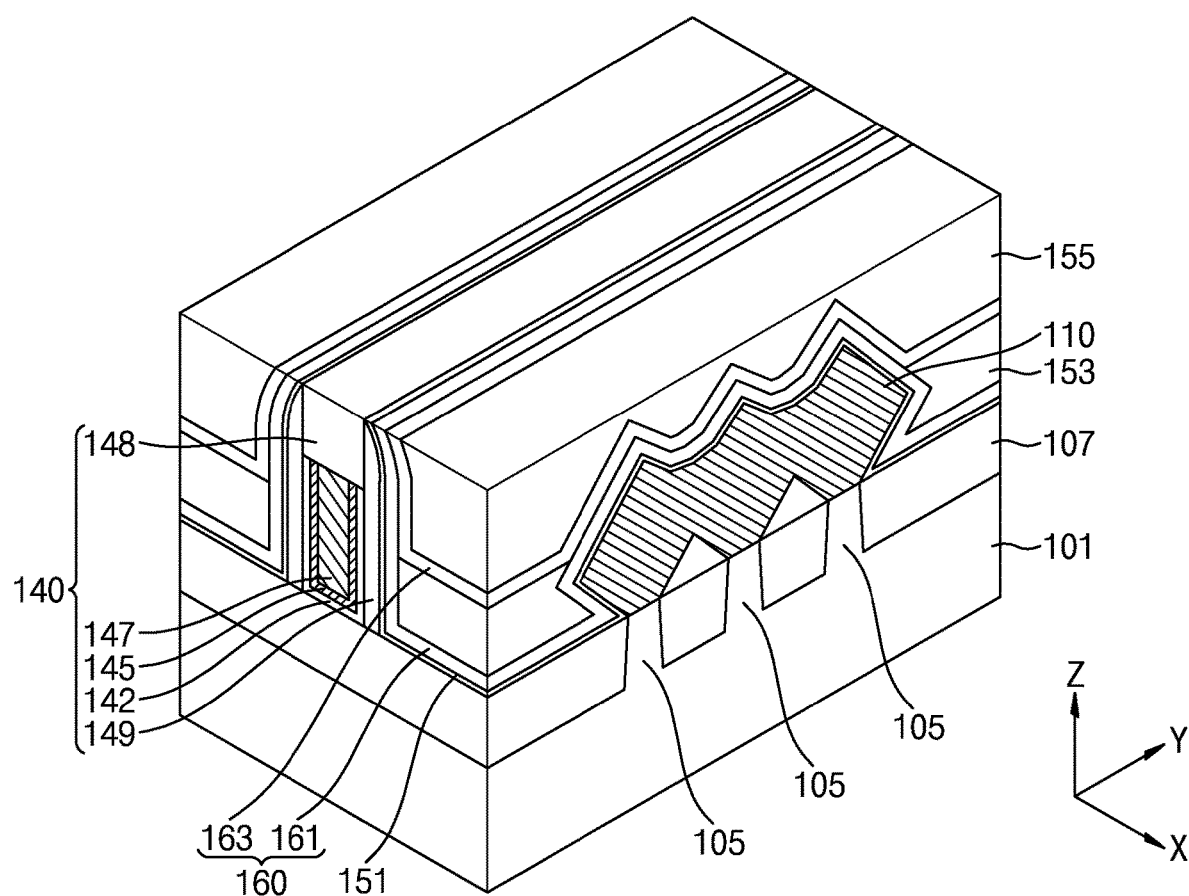

Referring to FIG. 21, a gate structure 140 may be formed by forming a gate insulating layer 142, first and second gate electrodes 145 and 147, and a gate capping layer 148 in the first opening OP1 (see FIG. 20). The gate insulating layer 142 may be substantially formed conformally along sidewalls and a lower surface of the first opening OP1. The gate insulating layer 142 may include an oxide, a nitride, or a high-k dielectric material. The first and second gate electrodes 145 and 147 may include a metal or semiconductor material. Upper portions of the gate insulating layer 142 and the first and second gate electrodes 145 and 147 may be recessed, and the gate capping layer 148 may be formed to fill the recessed regions. The gate capping layer 148 may be formed, and a planarization process may be performed.

Figure 22:
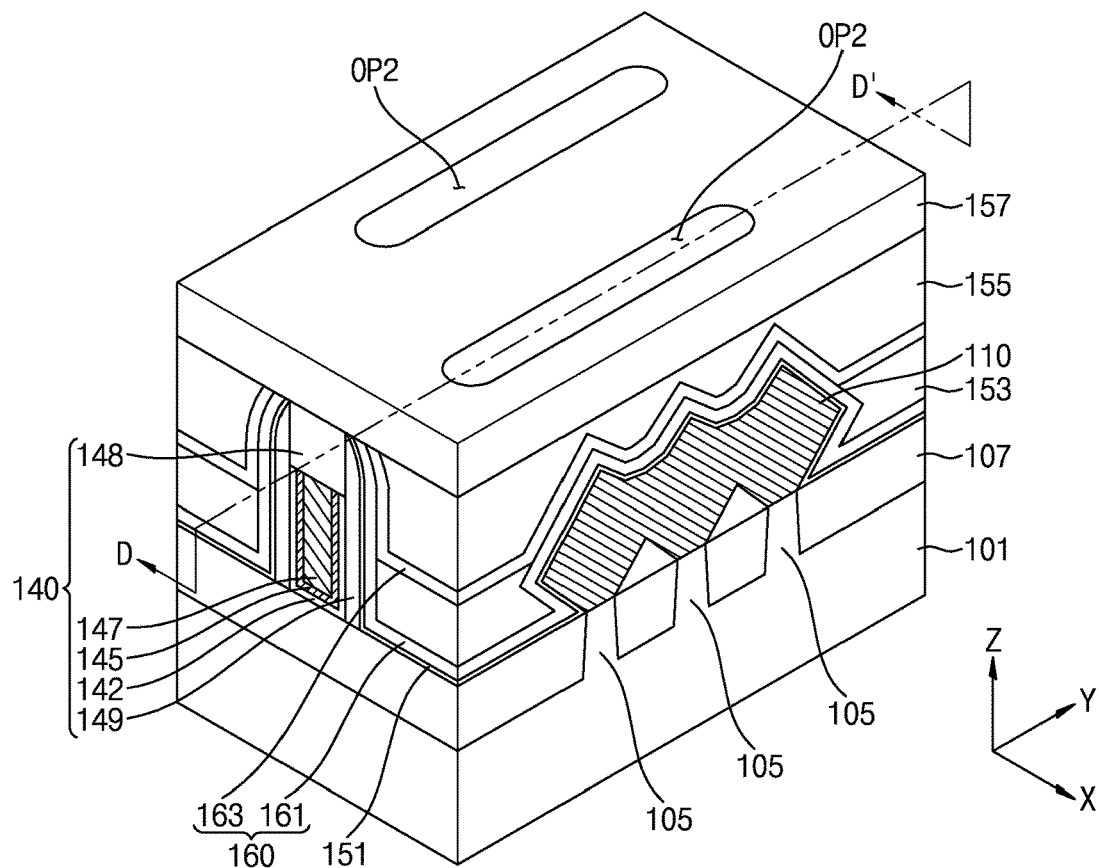
Figure 23:
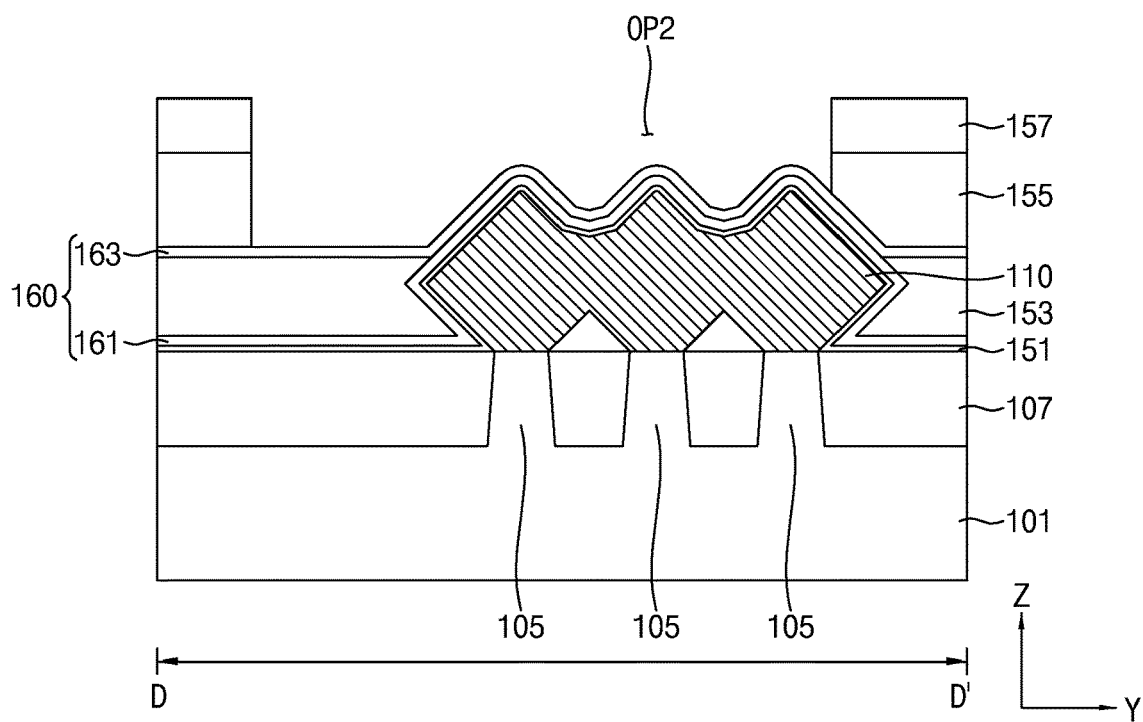

Referring to FIGS. 22 and 23, a second opening OP2 may be formed by patterning the second interlayer insulating layer 155. The second opening OP2 may be formed in a region in which the contact plug 180 (see FIGS. 1, 2, 5, and 9) is to be formed by removing a portion of the second interlayer insulating layer 155 through a separate mask layer 157 such as a photoresist pattern. An upper surface of the upper etch stop layer 163 may be exposed through the second opening OP2.

Figure 24:
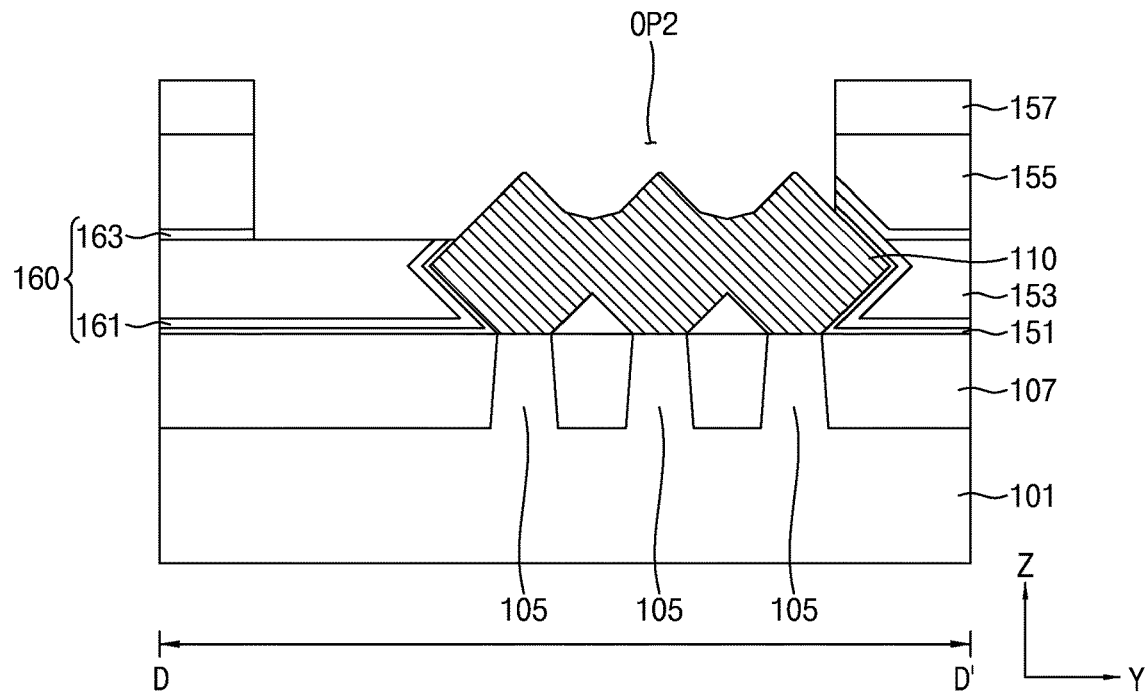

Referring to FIG. 24, the upper surface of the first interlayer insulating layer 153 may be exposed by removing the upper etch stop layer 163 exposed through the second opening OP2. An upper surface of the protective layer 151 may be exposed by removing the lower etch stop layer 161 together with the upper etch stop layer 163. The first interlayer insulating layer 153 and the protective layer 151 may be recessed in a process of etching the upper etch stop layer 163 and the lower etch stop layer 161. The upper etch stop layer 163 and the lower etch stop layer 161 may be removed and the exposed protective layer 151 may be removed, such that an upper surface of the source/drain regions 110 may be exposed through the second opening OP2. A portion of the first interlayer insulating layer 153 and portions of the source/drain region 110 may be recessed together in a process of etching the protective layer 151. Referring to FIGS. 24 and 10, the contact plug 180 may be formed by sequentially forming the silicide layer 181, the barrier layer 182, and the conductive layer 184 in the second opening OP2.

FIGS. 25 to 29 are views illustrating a method of manufacturing a semiconductor device according to some embodiments of the inventive concept. FIGS. 25 to 29 may be processes performed after the processes of FIGS. 11 to 15.

Figure 25:
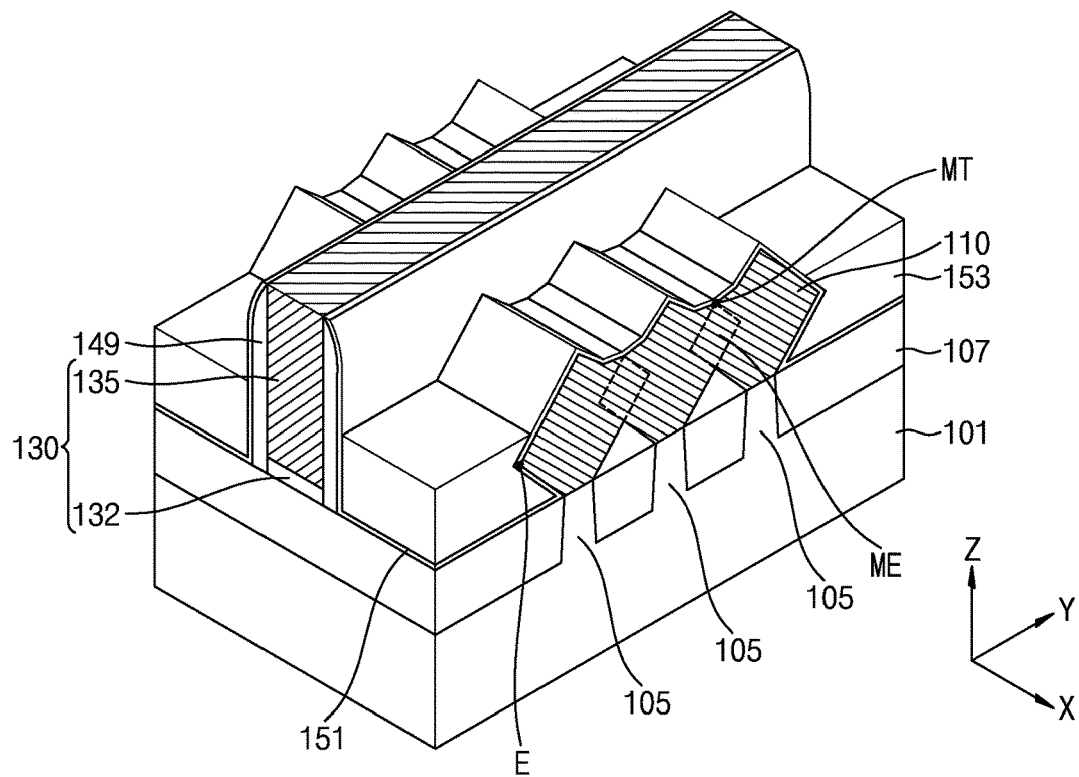
FIGS. 25 to 30 are views illustrating a method of manufacturing a semiconductor device according to example embodiments of the present inventive concept.

Referring to FIG. 25, a protective layer 151 may be formed to cover an isolation layer 107, source/drain regions 110, and a dummy gate structure 130. A first interlayer insulating layer 153 may be formed on the protective layer 151. The first interlayer insulating layer 153 may be formed by forming an insulating material layer covering the protective layer 151 and performing a planarization process of exposing an upper surface of the dummy gate electrode 135. The protective layer 151 on a dummy gate electrode 135 may be removed through the planarization process to expose an upper surface of the dummy gate electrode 135. The first interlayer insulating layer 153 may be partially removed such that an upper surface thereof has a level which matches or is lower than an upper end MT of a merged growth portion ME of the source/drain regions 110 and is higher than a corner E of the source/drain regions 110.

Figure 26:
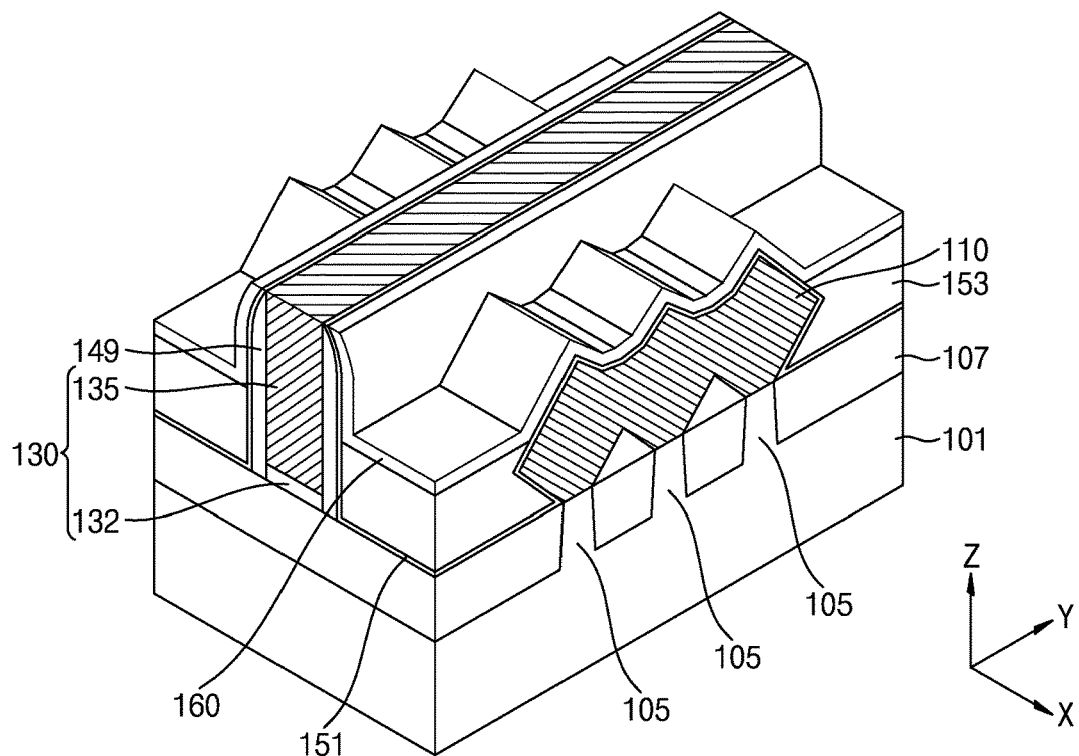

Referring to FIG. 26, an etch stop layer 160 may be formed to cover the upper surface of the first interlayer insulating layer 153, an exposed upper surface of the protective layer 151, and exposed side surfaces of the dummy gate structure 130. The etch stop layer 160 may be formed by forming an insulating material layer and performing a planarization process of exposing the upper surface of the dummy gate electrode 135.

Figure 27:
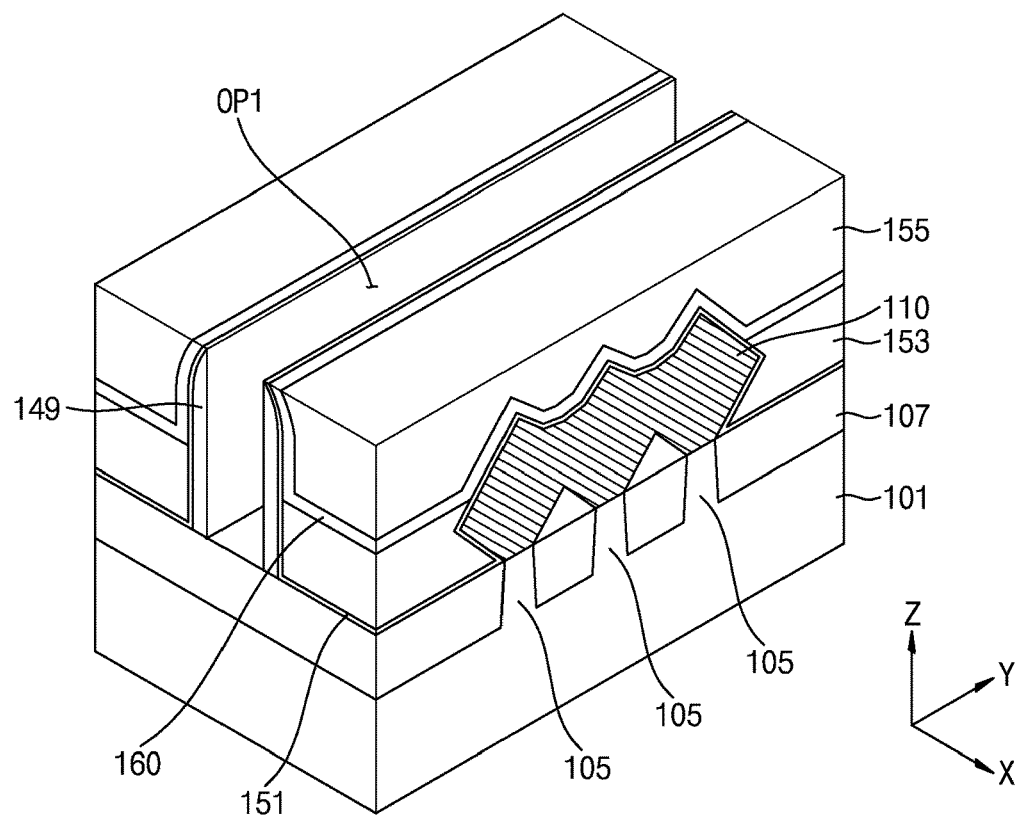

Referring to FIG. 27, a first opening OP1 may be formed by removing the dummy gate electrode 135 and a dummy gate insulating layer 132 through the exposed upper surface of the exposed dummy gate electrode 135.

Figure 28:
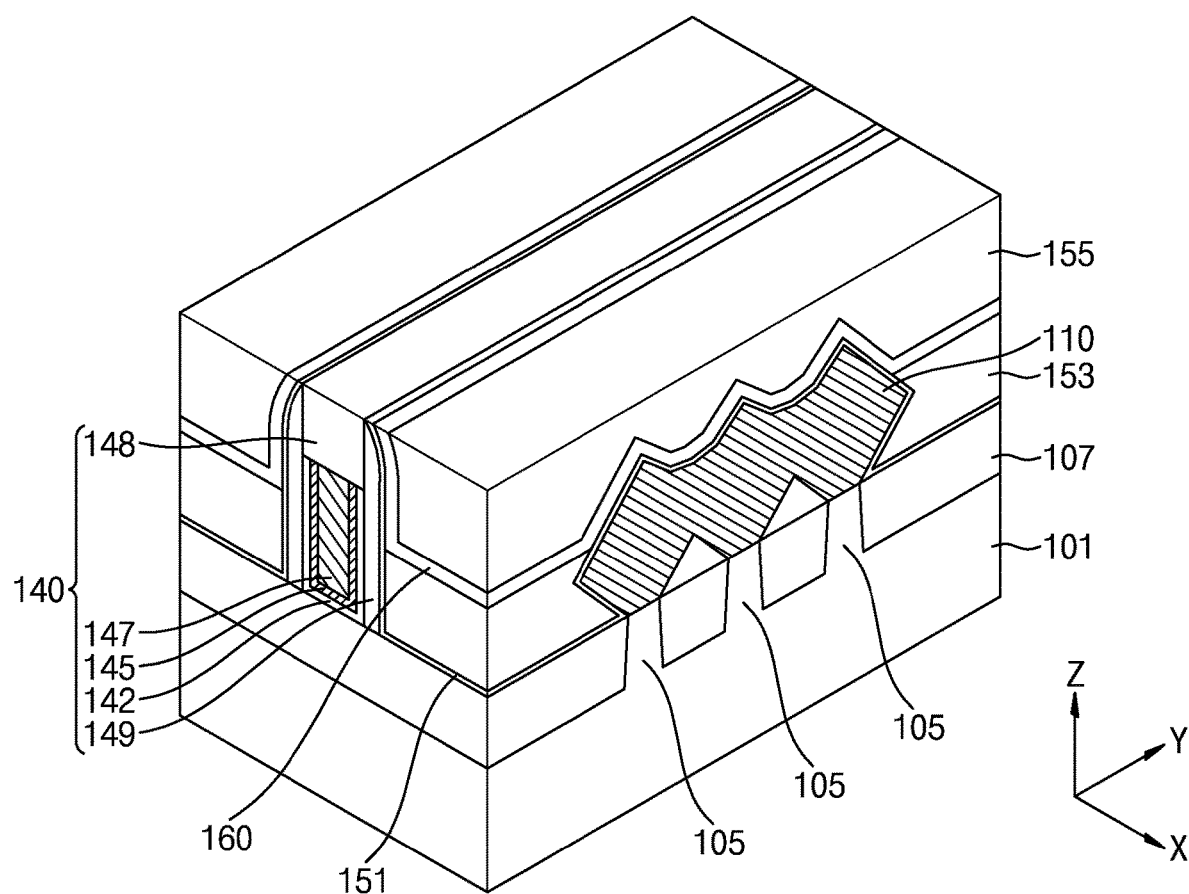

Referring to FIG. 28, a gate structure 140 may be formed by forming a gate insulating layer 142, first and second gate electrodes 145 and 147, and a gate capping layer 148 in the first opening OP1 (see FIG. 27).

Figure 29:
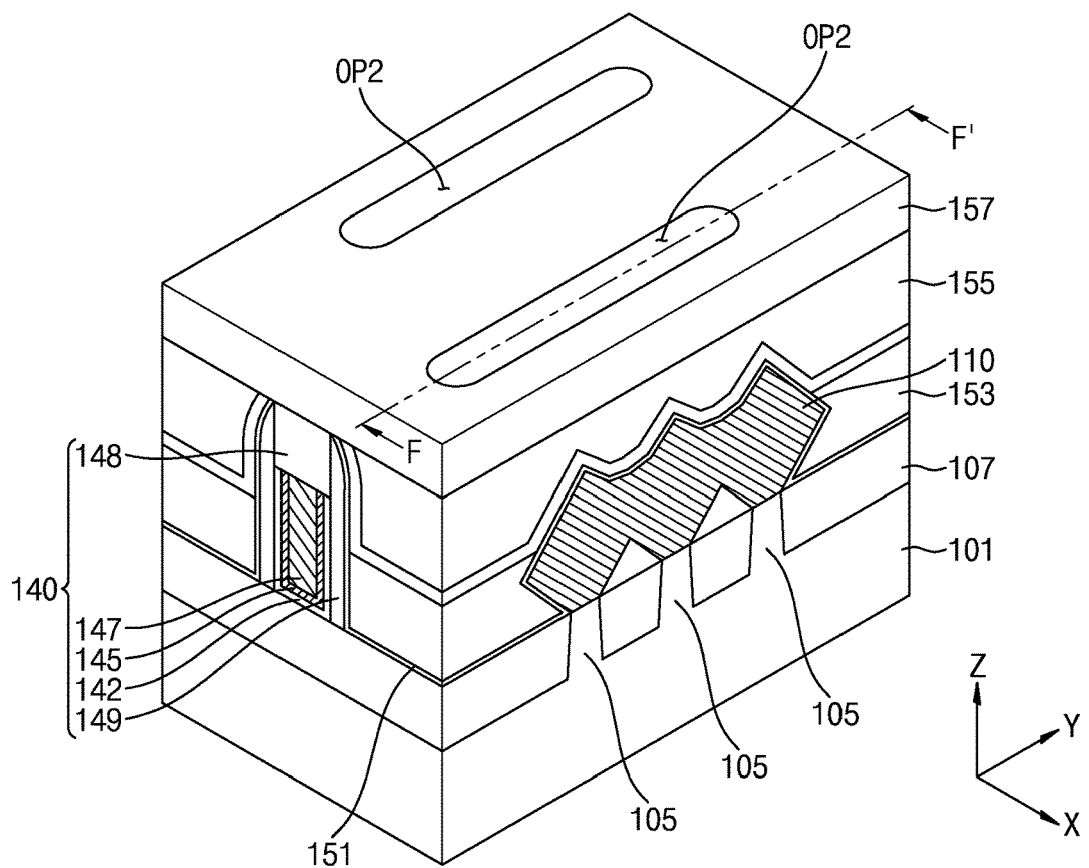
Figure 30:
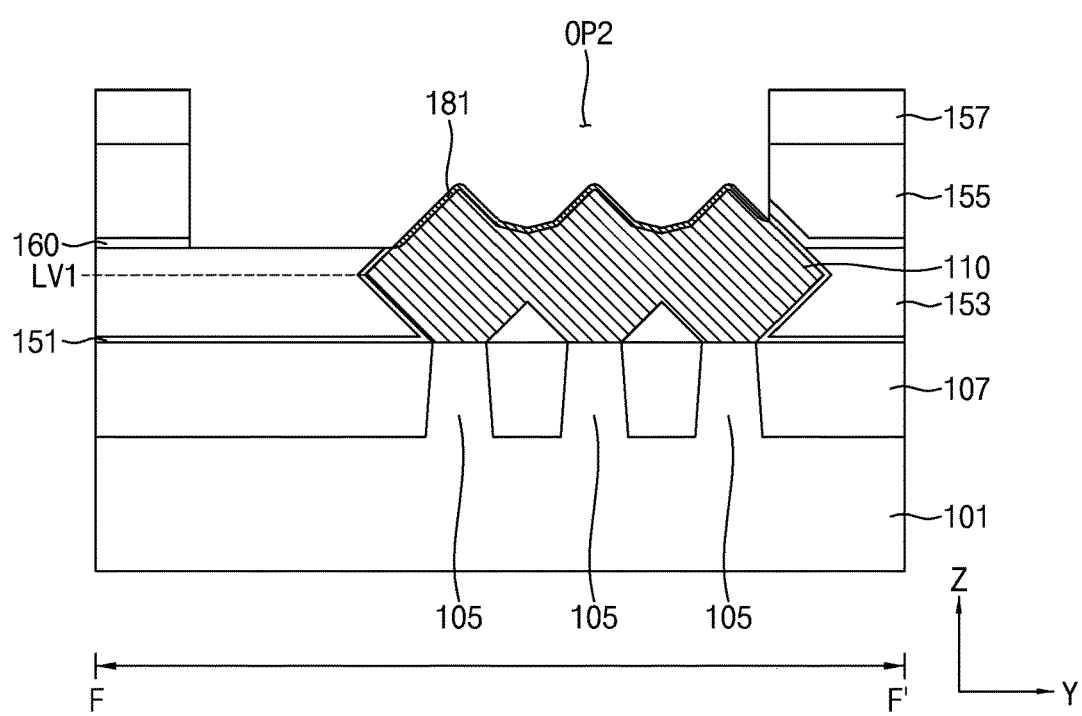

Referring to FIGS. 29 and 30, a second opening OP2 may be formed by patterning a second interlayer insulating layer 155. The second opening OP2 may be formed in a region in which the contact plug 180 (see FIGS. 1, 2, 5, and 9) is to be formed by removing a portion of the second interlayer insulating layer 155 through a separate mask layer 157 such as a photoresist pattern. An upper surface of the etch stop layer 160 may be exposed through the second opening OP2. The etch stop layer 160 having an exposed upper surface may be removed, and the upper surface of the first interlayer insulating layer 153 and the upper surface of the protective layer 151 may be exposed. The protective layer 151 may be removed, and surfaces of the source/drain regions 110 may be partially exposed. A silicide layer 181 may be formed on the exposed surfaces of the exposed source/drain regions 110.

Referring again to FIG. 6B, a contact plug 180 may be formed by sequentially forming a barrier layer 182 and a conductive layer 184 in the second opening OP2 (see FIG. 30).

According to some embodiments of the inventive concept, an etch stop layer can be provided to prevent an interlayer insulating layer from being excessively recessed in a process of forming a contact plug. The etch stop layer can function to adjust a depth of a contact hole in which the contact plug is disposed to minimize parasitic capacitance generated between the contact plug and a gate electrode.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
   a substrate;
   a first fin, a second fin and a third fin on the substrate, wherein the second fin is between the first fin and the third fin;
   a first isolation on the substrate, and between the first fin and the second fin;
   a second isolation on the substrate, and between the second fin and the third fin;
   a gate structure on the first fin, the second fin, the third fin, the first isolation, and the second isolation;
   a first epitaxial source/drain on the first fin;
   a second epitaxial source/drain on the second fin;
   a third epitaxial source/drain on the third fin;
   a fourth epitaxial source/drain on the first fin;
   a fifth epitaxial source/drain on the second fin;
   a sixth epitaxial source/drain on the third fin;
   a first contact on the first epitaxial source/drain, the second epitaxial source/drain, and the third epitaxial source/drain;
   a second contact on the fourth epitaxial source/drain, the fifth epitaxial source/drain, and the sixth epitaxial source/drain;
   a first upper contact electrically connected to the first contact; and
   a second upper contact electrically connected to the second contact,
   wherein the gate structure is between the first epitaxial source/drain and the fourth epitaxial source/drain, between the second epitaxial source/drain and the fifth epitaxial source/drain, and between the third epitaxial source/drain and the sixth epitaxial source/drain,
   wherein the gate structure is between the first contact and the second contact,
   wherein the first epitaxial source/drain, the second epitaxial source/drain and the third epitaxial source/drain are merged,
   wherein the fourth epitaxial source/drain, the fifth epitaxial source/drain and the sixth epitaxial source/drain are merged,
   wherein from a top view, the first fin, the second fin, and the third fin are between the first upper contact and the second upper contact, wherein the first contact comprises a first end and a second end, the first end contacting the first upper contact,
wherein the second contact comprises a third end and a fourth end, the fourth end contacting the second upper contact,
wherein a distance between the first end of the first contact and the first fin is greater than a distance between the third end of the second contact and the first fin, and
wherein a distance between the fourth end of the second contact and the third fin is greater than a distance between the second end of the first contact and the third fin.

2. The semiconductor device of claim 1,
wherein the second end of the first contact does not contact the second upper contact, and
wherein the third end of the second contact does not contact the first upper contact.

3. The semiconductor device of claim 1,
wherein the distance between the first end of the first contact and the first fin is greater than a distance between the second end of the first contact and the third fin, and
wherein the distance between the fourth end of the second contact and the third fin is greater than a distance between the third end of the second contact and the first fin.

4. The semiconductor device of claim 1,
wherein the first epitaxial source/drain, the second epitaxial source/drain and the third epitaxial source/drain are merged to form a first merged epitaxial source/drain,
wherein the fourth epitaxial source/drain, the fifth epitaxial source/drain, and the sixth epitaxial source/drain are merged to form a second merged epitaxial source/drain,
wherein a top surface of the first merged epitaxial source/drain comprises a first recess and a second recess, and
wherein a top surface of the second merged epitaxial source/drain comprises a third recess and a fourth recess.

5. The semiconductor device of claim 1, wherein each of the first upper contact and the second upper contact crosses the gate structure.

6. The semiconductor device of claim 1, wherein each of the first through the sixth epitaxial source/drains is polygon-shaped, circle-shaped, or rectangle-shaped.

7. The semiconductor device of claim 1, wherein the gate structure comprises a gate insulation layer that includes oxide (Al2O3), tantalum oxide (Ta2O3), titanium oxide (TiO2), yttrium oxide (Y2O3), zirconium oxide (ZrO2), zirconium silicon oxide (ZrSixOy), hafnium oxide (HfO2), hafnium silicon oxide (HfSixOy), lanthanum oxide (La2O3), lanthanum aluminum oxide (LaAlxOy), lanthanum hafnium oxide (LaHfxOy), hafnium aluminum oxide (HfAlxOy) and/or praseodymium oxide (Pr2O3).

8. The semiconductor device of claim 1, wherein the gate structure comprises a gate insulation layer that includes titanium nitride (TiN), tantalum nitride (TaN) and/or tungsten nitride (WN).

9. A semiconductor device comprising;
a substrate;
a first fin, a second fin and a third fin on the substrate, wherein the second fin is between the first fin and the third fin;
a first isolation on the substrate;
a second isolation on the substrate, and between the first fin and the second fin, wherein the first fin is between the first isolation and the second isolation;
a third isolation on the substrate, and between the second fin and the third fin;
a fourth isolation on the substrate, wherein the third fin is between the third isolation and the fourth isolation;
a gate structure on the first fin, the second fin, the third fin, the first isolation, the second isolation, the third isolation, and the fourth isolation;
a first epitaxial source/drain on the first fin;
a second epitaxial source/drain on the second fin;
a third epitaxial source/drain on the third fin, the first epitaxial source/drain, and the second epitaxial source/drain, wherein the third epitaxial source/drain is merged to form a first merged epitaxial source/drain;
a fourth epitaxial source/drain on the first fin;
a fifth epitaxial source/drain on the second fin;
a sixth epitaxial source/drain on the third fin, the fourth epitaxial source/drain, and the fifth epitaxial source/drain, wherein the sixth epitaxial source/drain is merged to form a second merged epitaxial source/drain;
a first contact on the first epitaxial source/drain, the second epitaxial source/drain and the third epitaxial source/drain;
a second contact on the fourth epitaxial source/drain, the fifth epitaxial source/drain and the sixth epitaxial source/drain;
a first upper contact crossing the gate structure and electrically connected to the first contact;
a second upper contact crossing the gate structure and electrically connected to the second contact;
a first layer on the first isolation, the first merged epitaxial source/drain and the fourth isolation, and comprising a first portion, a second portion and a third portion, wherein the first portion of the first layer contacts the first isolation, wherein the second portion of the first layer contacts the fourth isolation, and wherein the third portion of the first layer contacts the first merged epitaxial source/drain;
a second layer on the first portion of the first layer;
a third layer on the second portion of the first layer; and
a fourth layer on the second layer, the third portion of the first layer, and the third layer,
wherein the gate structure is between the first epitaxial source/drain and the fourth epitaxial source/drain, between the second epitaxial source/drain and the fifth epitaxial source/drain, and between the third epitaxial source/drain and the sixth epitaxial source/drain,
wherein the gate structure is between the first contact and the second contact, and
wherein from a top view, the first contact and the second contact are misaligned to each other.

10. The semiconductor device of claim 9,
wherein the first contact comprises a first end and a second end, the first end contacting the first upper contact,
wherein the second contact comprises a third end and a fourth end, the fourth end contacting the second upper contact,
wherein a distance between the first end of the first contact and the first fin is greater than a distance between the third end of the second contact and the first fin, and
wherein a distance between the fourth end of the second contact and the third fin is greater than a distance between the second end of the first contact and the third fin.

11. The semiconductor device of claim 10,
wherein the second end of the first contact does not contact the second upper contact,
wherein the third end of the second contact does not contact the first upper contact,
wherein the distance between the first end of the first contact and the first fin is greater than a distance between the second end of the first contact and the third fin, and
wherein the distance between the fourth end of the second contact and the third fin is greater than a distance between the third end of the second contact and the first fin.

12. The semiconductor device of claim 10, wherein the first end of the first contact is outward from the first merged epitaxial source/drain, and the second end of the first contact is on the first merged epitaxial source/drain.

13. The semiconductor device of claim 9, wherein from a top view, the first fin, the second fin and the third fin are between the first upper contact and the second upper contact.

14. The semiconductor device of claim 9,
wherein a top surface of the first merged epitaxial source/drain is even, and
wherein a top surface of the second merged epitaxial source/drain is uneven.

15. A semiconductor device comprising:
a substrate;
a first isolation on the substrate;
a second isolation on the substrate;
a fin on the substrate, and between the first isolation and the second isolation;
a first epitaxial source/drain on the fin;
a second epitaxial source/drain on the fin;
a gate structure on the fin, the first isolation, and the second isolation, and between the first epitaxial source/drain and the second epitaxial source/drain, wherein the gate structure extends in a first direction;
a first contact on the first epitaxial source/drain, wherein the first contact extends in the first direction;
a second contact on the second epitaxial source/drain, wherein the second contact extends in the first direction;
a first upper contact electrically connected to the first contact, wherein the first upper contact extends in a second direction intersecting the first direction; and
a second upper contact electrically connected to the second contact, wherein the second upper contact extends in the second direction,
wherein the gate structure is between the first contact and the second contact,
wherein the first contact comprises a first end contacting the first upper contact and a second end contacting the first epitaxial source/drain,
wherein the second contact comprises a third end contacting the second epitaxial source/drain and a fourth end contacting the second upper contact,
wherein the second end of the first contact is spaced apart from the second upper contact in the first direction, and
wherein the third end of the second contact is spaced apart from the first upper contact in the first direction.

16. The semiconductor device of claim 15, wherein from a top view, the fin is between the first upper contact and the second upper contact.

17. The semiconductor device of claim 15,
wherein a distance between the first end of the first contact and the fin is greater than a distance between the third end of the second contact and the fin, and
wherein a distance between the fourth end of the second contact and the fin is greater than a distance between the second end of the first contact and the fin.

18. The semiconductor device of claim 15, further comprising:
a first layer on the first isolation, the first epitaxial source/drain, and the second isolation, wherein the first layer comprises a first portion, a second portion and a third portion, wherein the first portion of the first layer contacts the first isolation, wherein the second portion of the first layer contacts the second isolation, and wherein the third portion of the first layer contacts the first epitaxial source/drain;
a second layer on the first portion of the first layer;
a third layer on the second portion of the first layer; and
a fourth layer on the second layer, the third portion of the first layer, and the third layer.

19. The semiconductor device of claim 15, wherein from a top view, the first contact and the second contact are misaligned to each other.

20. The semiconductor device of claim 15,
wherein the second end of the first contact does not contact the second upper contact, and
wherein the third end of the second contact does not contact the first upper contact.

* * * * *